US012677461B2

(12) United States Patent
Chen et al.

(10) Patent No.: US 12,677,461 B2
(45) Date of Patent: Jul. 7, 2026

(54) FIN FIELD-EFFECT TRANSISTOR DEVICE AND METHODS OF FORMING

(71) Applicant: Taiwan Semiconductor Manufacturing Co., Ltd., Hsinchu (TW)

(72) Inventors: Pin-Wen Chen, Keelung City (TW); Yu-Chen Ko, Chiayi City (TW); Chi-Yuan Chen, Hsinchu (TW); Ya-Yi Cheng, Taichung City (TW); Chun-I Tsai, Hsinchu (TW); Wei-Jung Lin, Hsinchu (TW); Chih-Wei Chang, Hsinchu (TW); Ming-Hsing Tsai, Chu-Pei City (TW); Syun-Ming Jang, Hsinchu (TW); Wei-Jen Lo, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 310 days.

(21) Appl. No.: 18/449,443

(22) Filed: Aug. 14, 2023

(65) Prior Publication Data

US 2024/0363353 A1     Oct. 31, 2024

Related U.S. Application Data

(60) Provisional application No. 63/498,548, filed on Apr. 27, 2023.

(51) Int. Cl.
H10D 64/01 (2025.01)
H10D 30/01 (2025.01)
(Continued)

(52) U.S. Cl.
CPC ....... H10D 64/0112 (2026.01); H10D 30/024 (2025.01); H10D 30/6211 (2025.01); H10D 64/62 (2025.01)

(58) Field of Classification Search
CPC ............ H01L 21/28518; H10D 30/024; H10D 30/6211; H10D 64/62
(Continued)

(56) References Cited

U.S. PATENT DOCUMENTS 6,271,120 B1     8/2001   Huang et al.
6,919,273 B1     7/2005   Otsuki et al.
(Continued)

FOREIGN PATENT DOCUMENTS

JP        2000332105 A     11/2000
KR     20210096582 A      8/2021

*Primary Examiner* — Monica D Harrison
(74) *Attorney, Agent, or Firm* — Slater Matsil, LLP

(57) ABSTRACT

A method of forming a semiconductor device includes: forming a gate structure over a fin that protrudes above a substrate; forming a source/drain region over the fin adjacent to the gate structure; forming an interlayer dielectric (ILD) layer over the source/drain region around the gate structure; forming an opening in the ILD layer to expose the source/drain region; forming a silicide region and a barrier layer successively in the openings over the source/drain region, where the barrier layer includes silicon nitride; reducing a concentration of silicon nitride in a surface portion of the barrier layer exposed to the opening; after the reducing, forming a seed layer on the barrier layer; and forming an electrically conductive material on the seed layer to fill the opening.

20 Claims, 35 Drawing Sheets

(51) Int. Cl.
    *H10D 30/62*         (2025.01)
    *H10D 64/62*         (2025.01)

(58) Field of Classification Search
    USPC ......................................................... 257/384
    See application file for complete search history.

(56)                    References Cited

U.S. PATENT DOCUMENTS

| | | |
|---|---|---|
| 9,105,490 B2 | 8/2015 | Wang et al. |
| 9,236,267 B2 | 1/2016 | De et al. |
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,831,183 B2 | 11/2017 | Lin et al. |
| 9,859,386 B2 | 1/2018 | Ho et al. |
| 10,944,009 B2 * | 3/2021 | Wang ................... H10D 64/021 |
| 12,087,575 B2 | 9/2024 | Chang et al. |
| 2002/0168468 A1 | 11/2002 | Chou et al. |
| 2006/0154481 A1 | 7/2006 | Wu et al. |
| 2008/0293247 A1 | 11/2008 | Furuya et al. |
| 2018/0151373 A1 | 5/2018 | Tsai et al. |
| 2019/0333808 A1 * | 10/2019 | Wu ................... H01L 23/53266 |
| 2021/0257255 A1 | 8/2021 | Liu et al. |
| 2022/0140079 A1 | 5/2022 | Liu et al. |

* cited by examiner

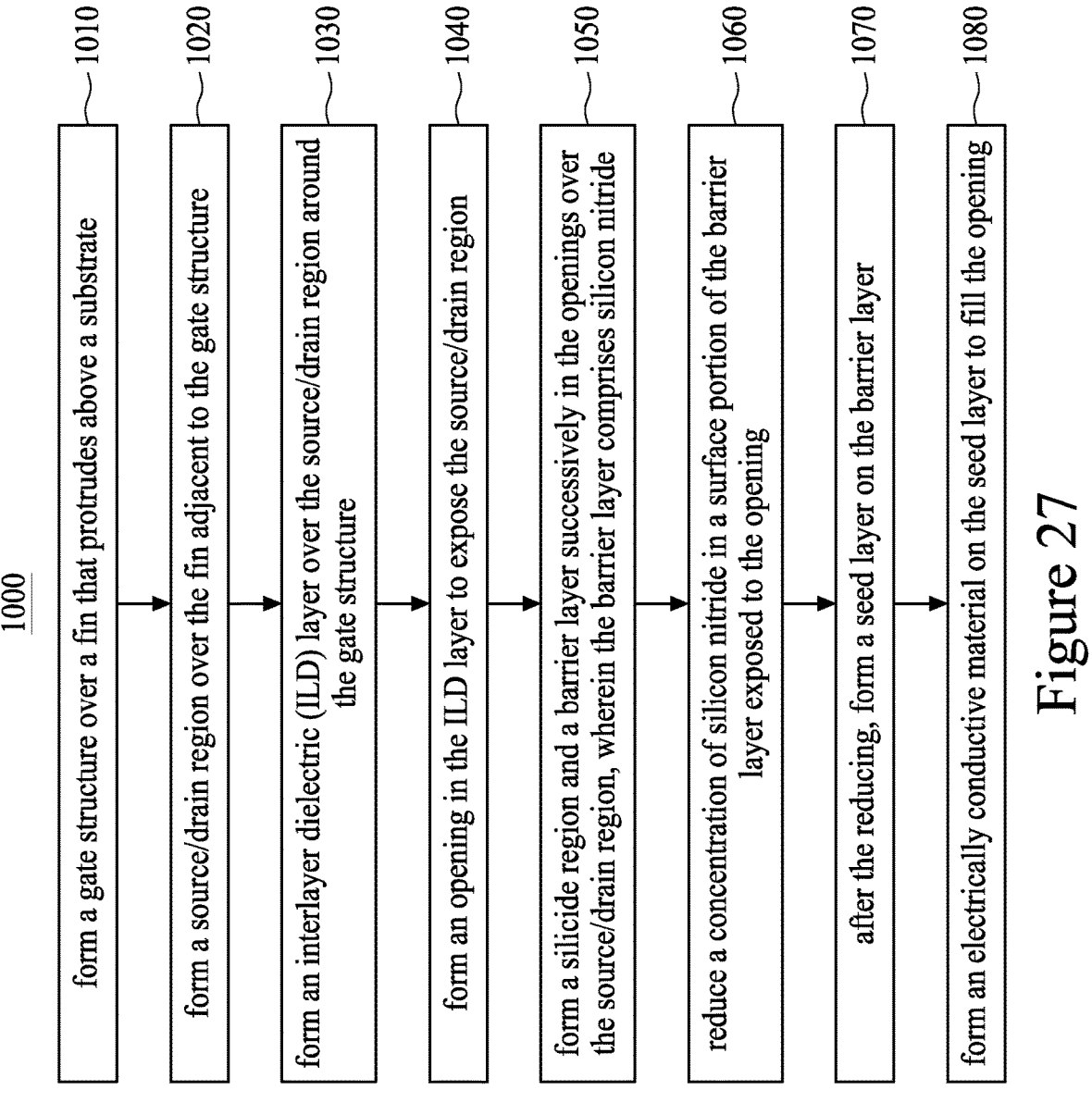

1000 form a gate structure over a fin that protrudes above a substrate — 1010 form a source/drain region over the fin adjacent to the gate structure — 1020 form an interlayer dielectric (ILD) layer over the source/drain region around the gate structure — 1030 form an opening in the ILD layer to expose the source/drain region — 1040 form a silicide region and a barrier layer successively in the openings over the source/drain region, wherein the barrier layer comprises silicon nitride — 1050 reduce a concentration of silicon nitride in a surface portion of the barrier layer exposed to the opening — 1060 after the reducing, form a seed layer on the barrier layer — 1070 form an electrically conductive material on the seed layer to fill the opening — 1080

Figure 27

FIN FIELD-EFFECT TRANSISTOR DEVICE AND METHODS OF FORMING

PRIORITY CLAIM AND CROSS-REFERENCE

This application claims priority to U.S. Provisional Patent Application No. 63/498,548, filed Apr. 27, 2023 and entitled "Seeding for Silicide Health Enhancement," which application is hereby incorporated by reference in its entirety.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

Fin Field-Effect Transistor (FinFET) devices are becoming commonly used in integrated circuits. FinFET devices have a three-dimensional structure that comprises a semiconductor fin protruding from a substrate. A gate structure, configured to control the flow of charge carriers within a conductive channel of the FinFET device, wraps around the semiconductor fin. For example, in a tri-gate FinFET device, the gate structure wraps around three sides of the semiconductor fin, thereby forming conductive channels on three sides of the semiconductor fin.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 27 illustrates a flow chart of method of forming a semiconductor device, in accordance with some embodiments.

DETAILED DESCRIPTION

Figure 1:
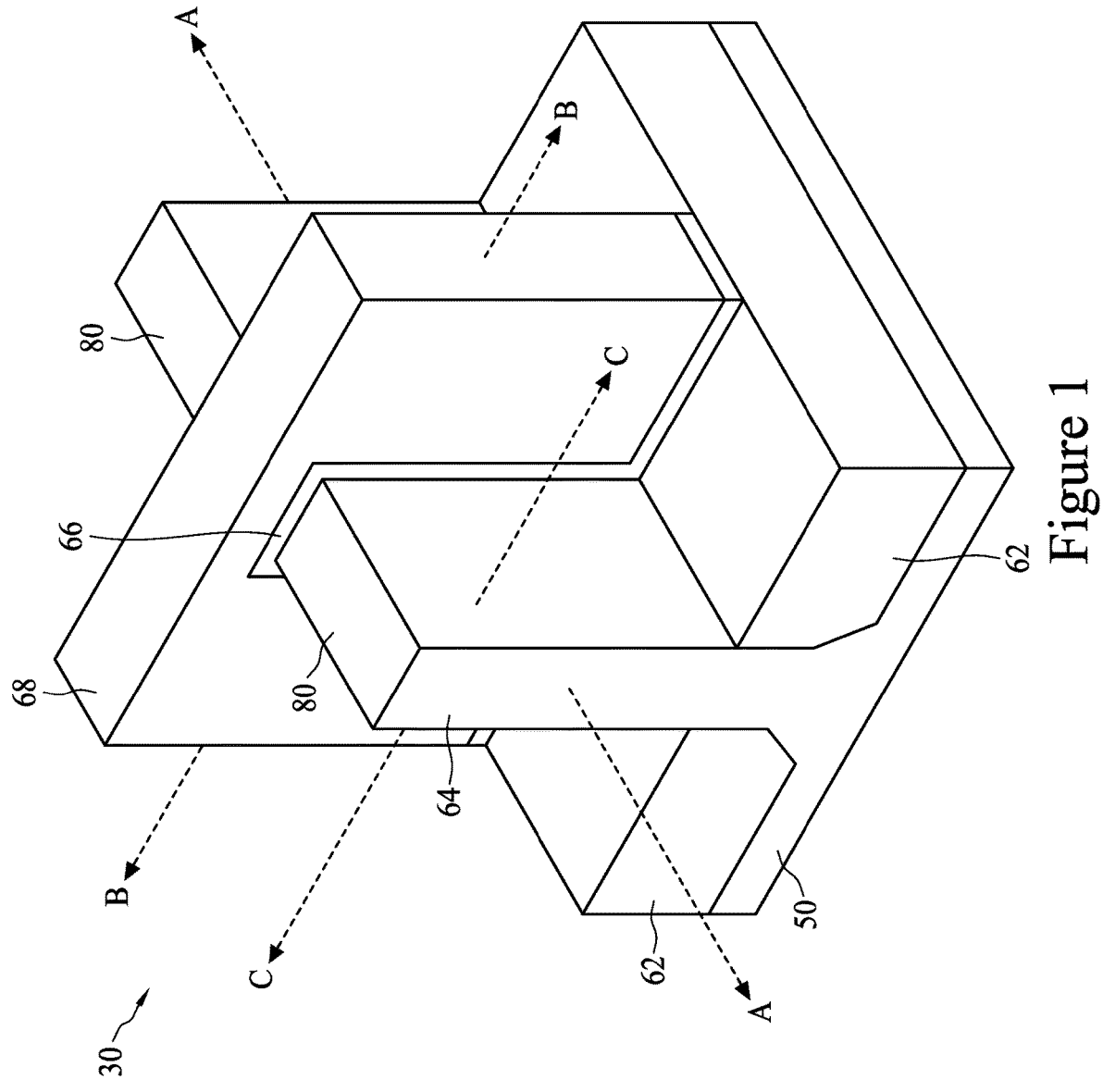
FIG. 1 illustrates a perspective view of a Fin Field-Effect Transistor (FinFET) device, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Throughout the discussion herein, unless otherwise specified, the same numeral in different figures refers to the same or similar component formed by a same or similar method using a same or similar material(s).

Embodiments of the present disclosure are discussed in the context of forming a FinFET device, and in particular, in the context of forming source/drain contact plugs for a FinFET device. Although the disclosed embodiments are discussed using FinFET devices as examples, the disclosed methods may also be used in other types of devices, such as planar devices, or nanostructure (e.g., nanosheet, nanowire) FET devices.

In some embodiments, to form a source/drain contact plug, an opening is formed in the interlayer dielectric layer to expose the source/drain region. A silicide region (e.g., titanium silicide) is formed on the source/drain region, and a barrier layer (e.g., comprising titanium silicon nitride (TiSiN) and SiN) is formed in the opening on the silicide region. Since a subsequent seed layer (e.g., W) may be difficult to form on a barrier layer having a high concentration of SiN, a surface treatment process (e.g., a dry plasma treatment, or a wet chemical treatment) is performed to reduce the concentration of SiN in the barrier layer. In another embodiment, a barrier layer with little or no SiN is formed on the silicide region without the need for the surface treatment. The barrier layer, with low concentration of SiN, allows the seed layer to be formed reliably on the barrier layer. An electrically conductive material is then formed over the seed layer to form the source/drain contact plug. The seed layer protects the silicide regions from damages caused by subsequent processing (e.g., etching, ashing), and also prevents diffusion of fluoride. As a result, the electrical resistance of the source/drain contact plugs is reduced, the device performance is improved, and production yield is improved.

FIG. 1 illustrates an example of a FinFET 30 in a perspective view. The FinFET 30 includes a substrate 50 and a fin 64 protruding above the substrate 50. Isolation regions 62 are formed on opposing sides of the fin 64, with the fin 64 protruding above the isolation regions 62. A gate dielectric 66 is along sidewalls and over a top surface of the fin 64, and a gate electrode 68 is over the gate dielectric 66. Source/drain regions 80 are in the fin 64 and on opposing sides of the gate dielectric 66 and the gate electrode 68. FIG. 1 further illustrates reference cross-sections that are used in later figures. Cross-section B-B extends along a longitudinal axis of the gate electrode 68 of the FinFET 30. Cross-section A-A is perpendicular to cross-section B-B and is along a longitudinal axis of the fin 64 and in a direction of, for example, a current flow between the source/drain regions 80. Cross-section C-C is parallel to cross-section B-B and is across the source/drain region 80. Subsequent figures refer to these reference cross-sections for clarity.

FIGS. 2-7, 8A-8C, 9, 10A, 10B, 11A, 11B, 12-18, and 19A-19C illustrate cross-sectional views of a FinFET device 100 at various stages of fabrication, in accordance with an embodiment. The FinFET device 100 is similar to the FinFET 30 in FIG. 1, but with multiple fins and multiple gate structures. FIGS. 2-5 and 19C illustrate cross-sectional views of the FinFET device 100 along cross-section B-B. FIGS. 6, 7, 8A, 9, 10A, 11A, and 19A illustrate cross-sectional views of the FinFET device 100 along cross-section A-A. FIGS. 8B, 8C, 10B, 11B, 12-18, and 19B illustrate cross-sectional views of the FinFET device 100 along cross-section C-C. Throughout the discussion herein, unless otherwise specified, figures with the same number but different alphabets (e.g., FIGS. 11A and 11B) refer to different cross-sectional views of a same device at a same stage of fabrication.

Figure 2:
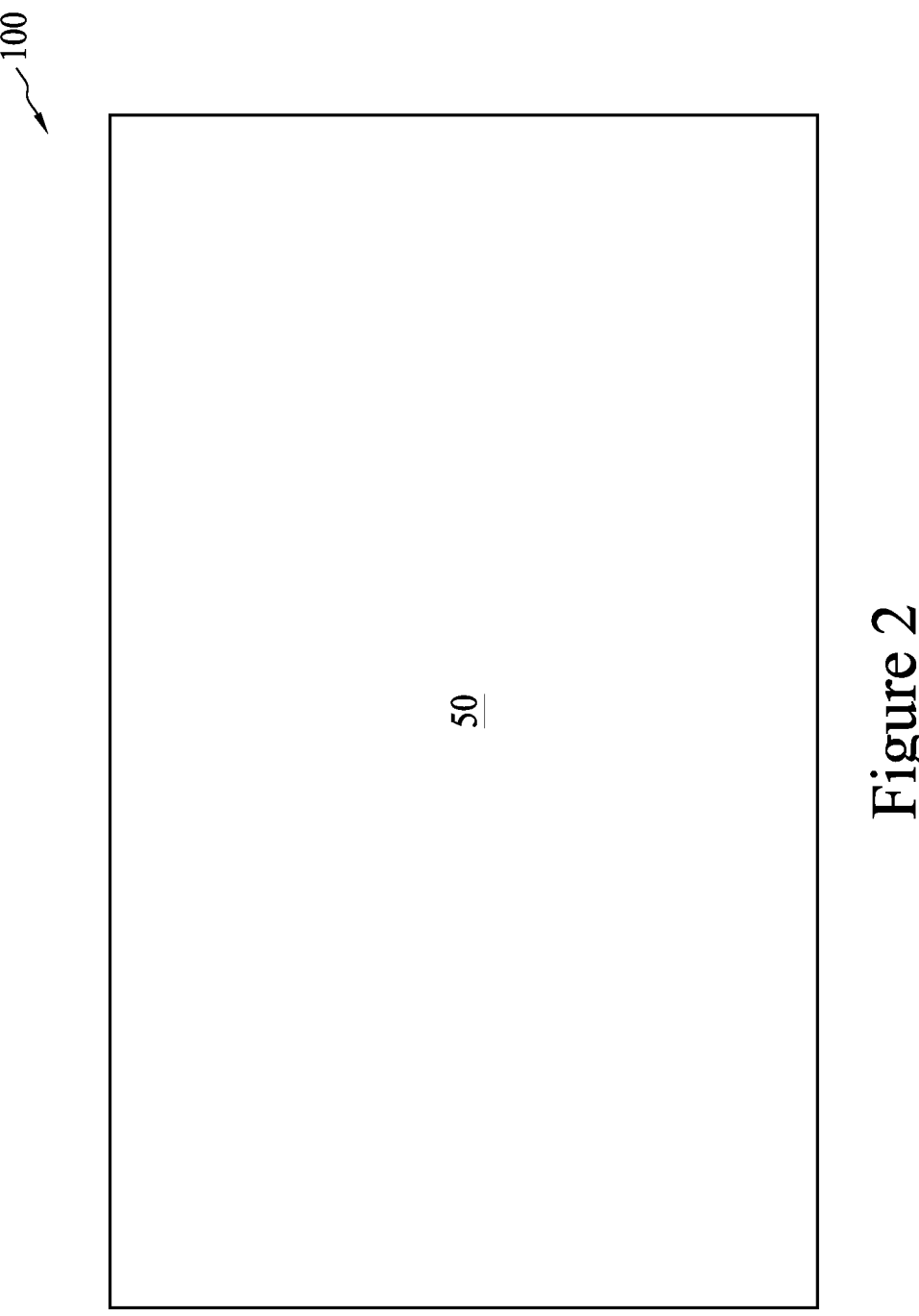
FIGS. 2-7, 8A-8C, 9, 10A, 10B, 11A, 11B, 12-18, and 19A-19C illustrate cross-sectional views of a FinFET device at various stages of fabrication, in accordance with an embodiment.

FIG. 2 illustrates a cross-sectional view of the substrate 50. The substrate 50 may be a semiconductor substrate, such as a bulk semiconductor, a semiconductor-on-insulator (SOI) substrate, or the like, which may be doped (e.g., with a P-type or an N-type dopant) or undoped. The substrate 50 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon substrate or a glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 3:
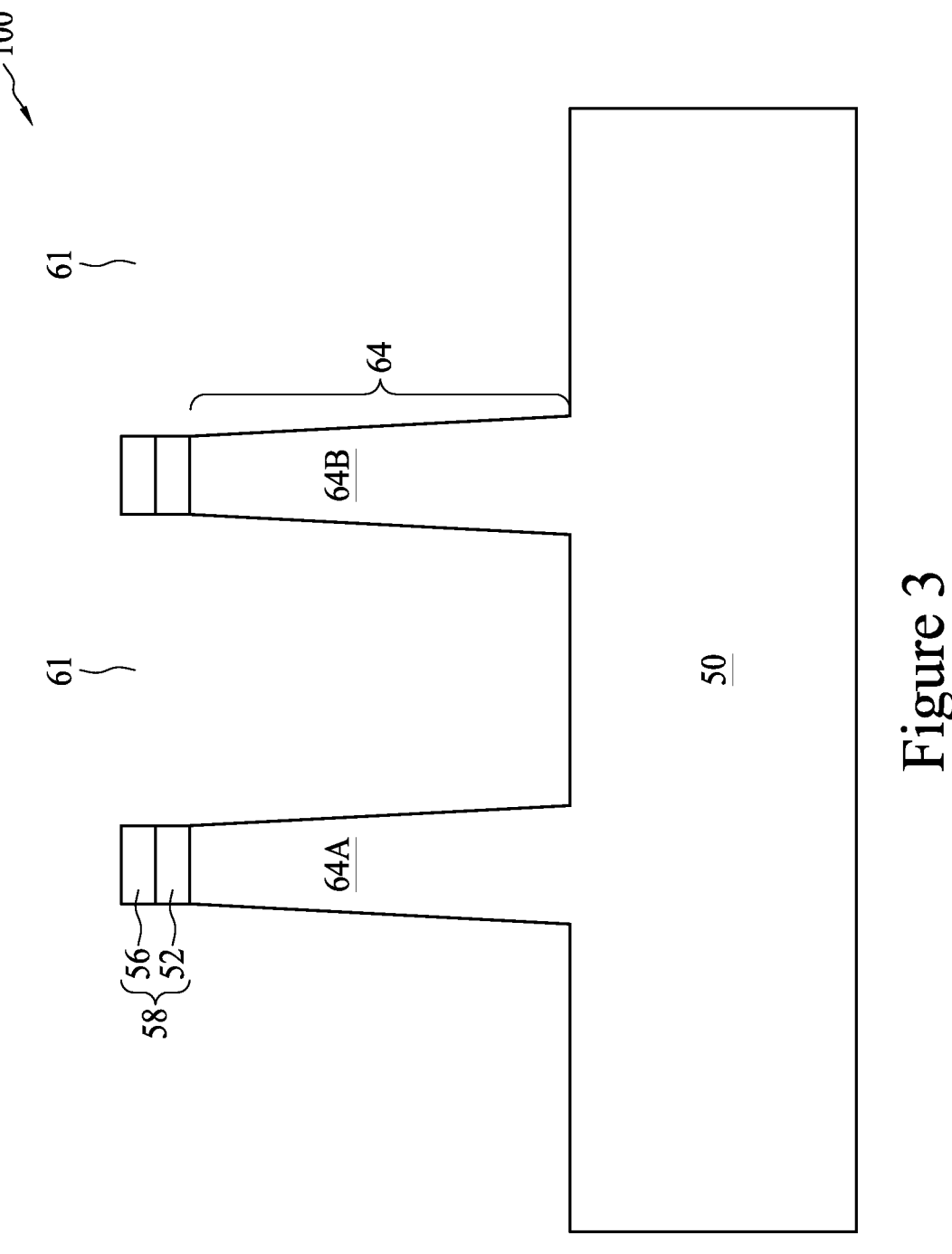

Referring to FIG. 3, the substrate 50 shown in FIG. 2 is patterned using, for example, photolithography and etching techniques. For example, a mask layer, such as a pad oxide layer 52 and an overlying pad nitride layer 56, is formed over the substrate 50. The pad oxide layer 52 may be a thin film comprising silicon oxide formed, for example, using a thermal oxidation process. The pad oxide layer 52 may act as an adhesion layer between the substrate 50 and the overlying pad nitride layer 56. In some embodiments, the pad nitride layer 56 is formed of silicon nitride, silicon oxynitride, silicon carbonitride, the like, or a combination thereof, and may be formed using low-pressure chemical vapor deposition (LPCVD) or plasma enhanced chemical vapor deposition (PECVD), as examples.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. In this example, the photoresist material is used to pattern the pad oxide layer 52 and pad nitride layer 56 to form a patterned mask 58, as illustrated in FIG. 3.

The patterned mask 58 is subsequently used to pattern exposed portions of the substrate 50 to form trenches 61, thereby defining semiconductor fins 64 (e.g., 64A and 64B) between adjacent trenches 61 as illustrated in FIG. 3. In some embodiments, the semiconductor fins 64 are formed by etching trenches in the substrate 50 using, for example, reactive ion etch (RIE), neutral beam etch (NBE), the like, or a combination thereof. The etching process may be anisotropic. In some embodiments, the trenches 61 may be strips (viewed from in the top) parallel to each other, and closely spaced with respect to each other. In some embodiments, the trenches 61 may be continuous and surround the semiconductor fins 64. The semiconductor fins 64 may also be referred to as fins 64 hereinafter.

The fins 64 may be patterned by any suitable method. For example, the fins 64 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 4:
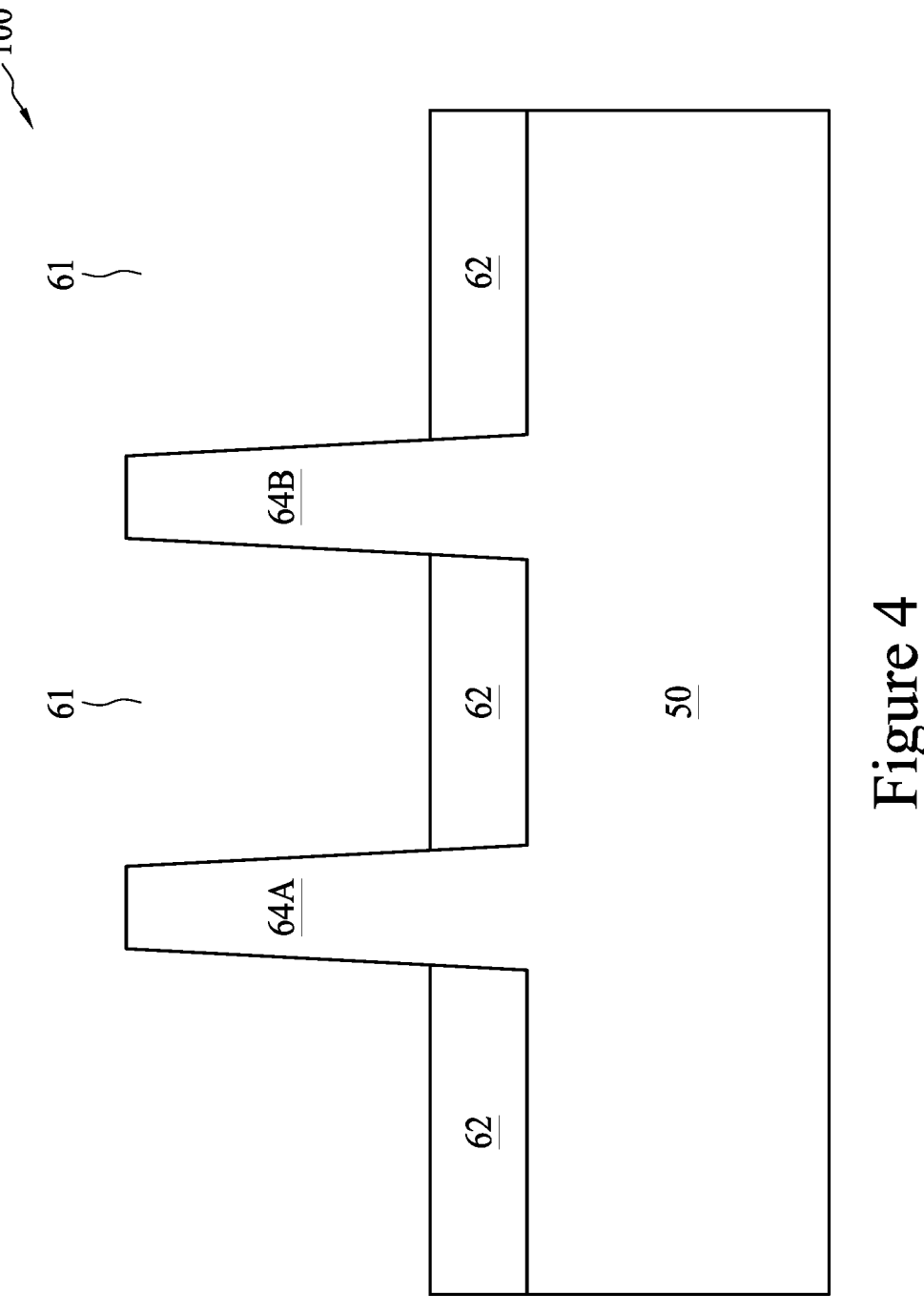

FIG. 4 illustrates the formation of an insulation material between neighboring semiconductor fins 64 to form isolation regions 62. The insulation material may be an oxide, such as silicon oxide, a nitride, the like, or a combination thereof, and may be formed by a high-density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials and/or other formation processes may be used. In the illustrated embodiment, the insulation material is silicon oxide formed by a FCVD process. An anneal process may be performed once the insulation material is formed. A planarization process, such as a chemical mechanical polish (CMP), may remove any excess insulation material and form top surfaces of the isolation regions 62 and top surfaces of the semiconductor fins 64 that are coplanar (not shown). The patterned mask 58 (see FIG. 3) may also be removed by the planarization process.

In some embodiments, the isolation regions 62 include a liner, e.g., a liner oxide (not shown), at the interface between the isolation region 62 and the substrate 50/semiconductor fins 64. In some embodiments, the liner oxide is formed to reduce crystalline defects at the interface between the substrate 50 and the isolation region 62. Similarly, the liner oxide may also be used to reduce crystalline defects at the interface between the semiconductor fins 64 and the isolation region 62. The liner oxide (e.g., silicon oxide) may be a thermal oxide formed through a thermal oxidation of a surface layer of substrate 50, although other suitable method may also be used to form the liner oxide.

Next, the isolation regions 62 are recessed to form shallow trench isolation (STI) regions 62. The isolation regions 62 are recessed such that the upper portions of the semiconductor fins 64 protrude from between neighboring STI regions 62. The top surfaces of the STI regions 62 may have a flat surface (as illustrated), a convex surface, a concave surface (such as dishing), or a combination thereof. The top surfaces of the STI regions 62 may be formed flat, convex, and/or concave by an appropriate etch. The isolation regions 62 may be recessed using an acceptable etching process, such as one that is selective to the material of the isolation regions 62. For example, a dry etch, or a wet etch using dilute hydrofluoric (dHF) acid, may be performed to recess the isolation regions 62.

FIGS. 2 through 4 illustrate an embodiment of forming fins 64, but fins may be formed in various different processes. For example, a top portion of the substrate 50 may be replaced by a suitable material, such as an epitaxial material suitable for an intended type (e.g., N-type or P-type) of semiconductor devices to be formed. Thereafter, the substrate 50, with epitaxial material on top, is patterned to form semiconductor fins 64 that comprise the epitaxial material.

As another example, a dielectric layer can be formed over a top surface of a substrate; trenches can be etched through the dielectric layer; homoepitaxial structures can be epitaxially grown in the trenches; and the dielectric layer can be recessed such that the homoepitaxial structures protrude from the dielectric layer to form fins.

In yet another example, a dielectric layer can be formed over a top surface of a substrate; trenches can be etched through the dielectric layer; heteroepitaxial structures can be epitaxially grown in the trenches using a material different from the substrate; and the dielectric layer can be recessed such that the heteroepitaxial structures protrude from the dielectric layer to form fins.

In embodiments where epitaxial material(s) or epitaxial structures (e.g., the heteroepitaxial structures or the homoepitaxial structures) are grown, the grown material(s) or structures may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fins 64 may comprise silicon germanium ($Si_xGe_{1-x}$, where x can be between 0 and 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 5:
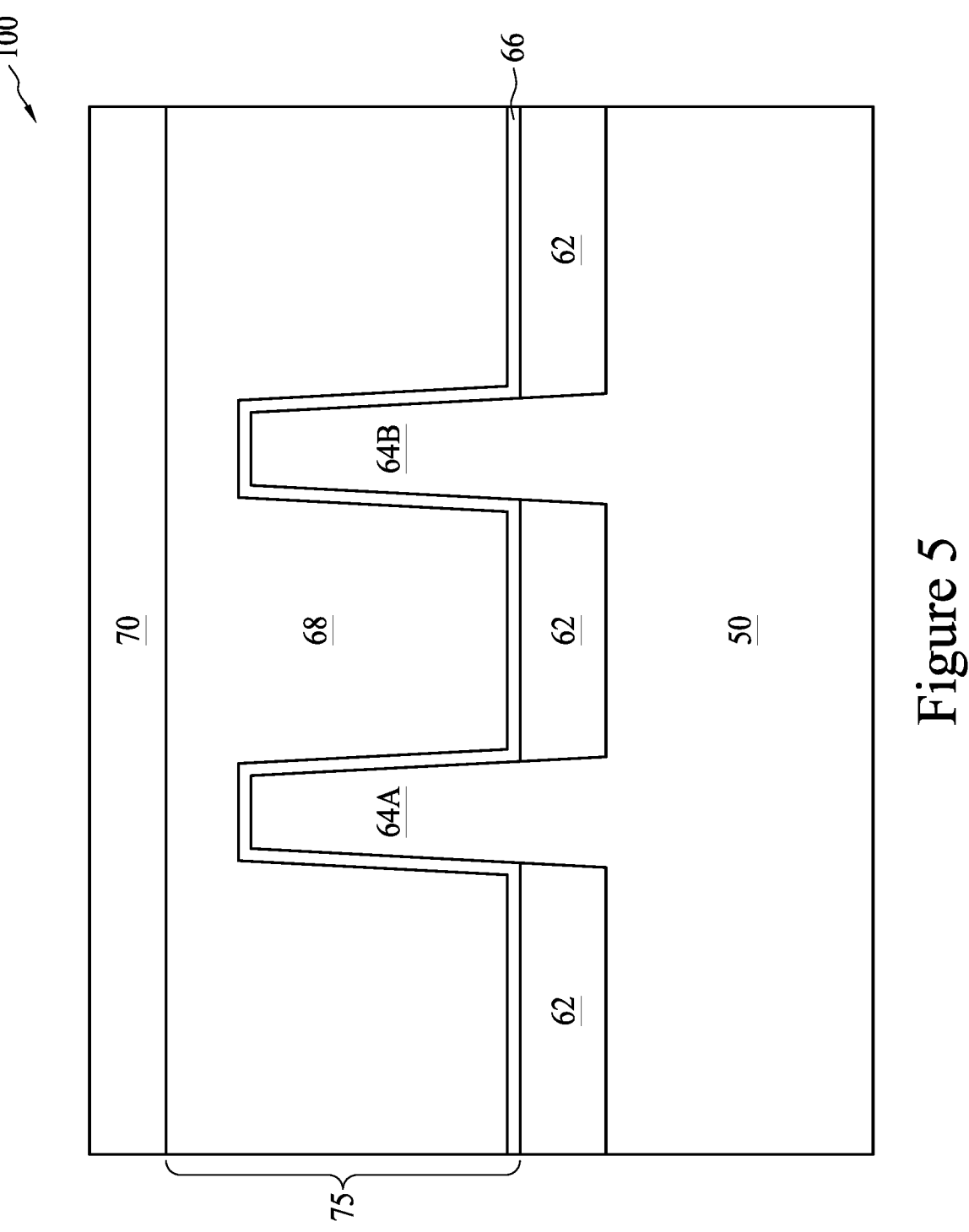

FIG. 5 illustrates the formation of dummy gate structure 75 over the semiconductor fins 64. Dummy gate structure 75 includes gate dielectric 66 and gate electrode 68, in some embodiments. A mask 70 may be formed over the dummy gate structure 75. To form the dummy gate structure 75, a dielectric layer is formed on the semiconductor fins 64. The dielectric layer may be, for example, silicon oxide, silicon nitride, multilayers thereof, or the like, and may be deposited or thermally grown.

A gate layer is formed over the dielectric layer, and a mask layer is formed over the gate layer. The gate layer may be deposited over the dielectric layer and then planarized, such as by a CMP. The mask layer may be deposited over the gate layer. The gate layer may be formed of, for example, polysilicon, although other materials may also be used. The mask layer may be formed of, for example, silicon nitride or the like.

After the layers (e.g., the dielectric layer, the gate layer, and the mask layer) are formed, the mask layer may be patterned using acceptable photolithography and etching techniques to form mask 70. The pattern of the mask 70 then may be transferred to the gate layer and the dielectric layer by an acceptable etching technique to form gate electrode 68 and gate dielectric 66, respectively. The gate electrode 68 and the gate dielectric 66 cover respective channel regions of the semiconductor fins 64. The gate electrode 68 may also have a lengthwise direction substantially perpendicular to the lengthwise direction of respective semiconductor fins 64.

The gate dielectric 66 is shown to be formed over the fins 64 (e.g., over top surfaces and sidewalls of the fins 64) and over the STI regions 62 in the example of FIG. 5. In other embodiments, the gate dielectric 66 may be formed by, e.g., thermal oxidization of a material of the fins 64, and therefore, may be formed over the fins 64 but not over the STI regions 62. These and other variations are fully intended to be included within the scope of the present disclosure.

FIGS. 6, 7, 8A, 9, 10A, 11A, and 19A illustrate cross-sectional views of the FinFET device 100 in further processing along cross-section A-A (along a longitudinal axis of the fin 64). Note that in FIGS. 6, 7, 8A, 9, 10A, 11A, and 19A, three gate structures (e.g., dummy gate structures 75A, 75B, and 75C, or replacement gate structures 97A, 97B, and 97C) are formed over the fin 64. One skilled in the art will appreciate that more or less than three gate structures may be formed over the fin 64, these and other variations are fully intended to be included within the scope of the present disclosure.

Figure 6:
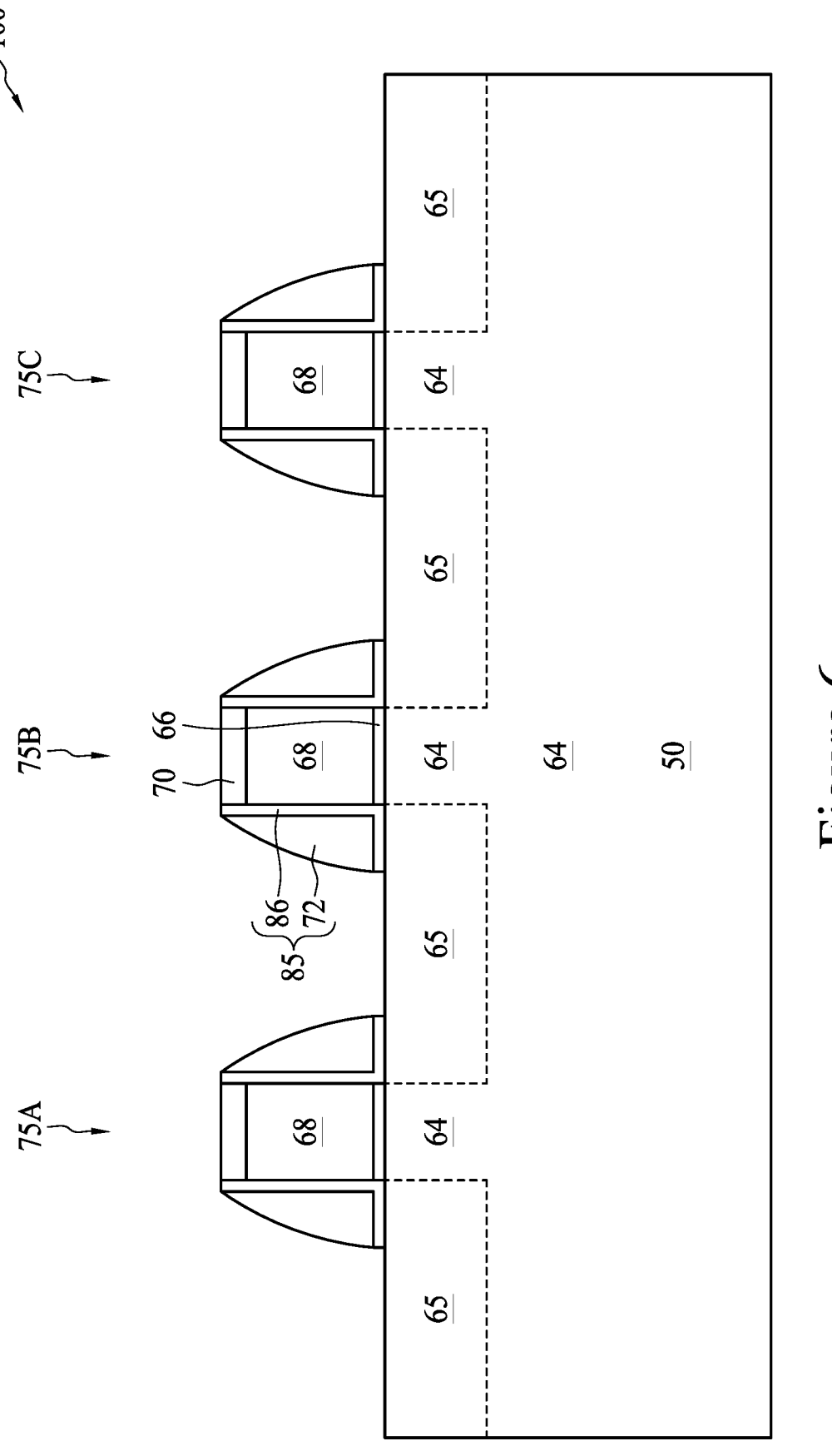

As illustrated in FIG. 6, lightly doped drain (LDD) regions 65 are formed in the fins 64. The LDD regions 65 may be formed by a plasma doping process. The plasma doping process may include forming and patterning masks such as a photoresist to cover the regions of the FinFET that are to be protected from the plasma doping process. The plasma doping process may implant N-type or P-type impurities in the fins 64 to form the LDD regions 65. For example, P-type impurities, such as boron, may be implanted in the fin 64 to form the LDD regions 65 for a P-type device. As another example, N-type impurities, such as phosphorus, may be implanted in the fin 64 to form the LDD regions 65 for an N-type device. In some embodiments, the LDD regions 65 abut the channel region of the FinFET device 100. Portions of the LDD regions 65 may extend under gate electrode 68 and into the channel region of the FinFET device 100. FIG. 6 illustrates a non-limiting example of the LDD regions 65. Other configurations, shapes, and formation methods of the LDD regions 65 are also possible and are fully intended to be included within the scope of the present disclosure. For example, LDD regions 65 may be formed after gate spacers 85 are formed. In some embodiments, the LDD regions 65 are omitted. For simplicity, the LDD regions 65 are not illustrated in subsequent figures, with the understanding the LDD regions 65 may be formed in the fin 64.

Still referring to FIG. 6, after the LDD regions 65 are formed, gate spacers 85 are formed around the dummy gate structures 75 (e.g., 75A, 75B, and 75C). The gate spacer 85 may include a first gate spacer 72 and a second gate spacer 86. For example, the first gate spacer 72 may be a gate seal spacer and is formed on opposing sidewalls of the gate electrode 68 and on opposing sidewalls of the gate dielectric 66. The second gate spacer 86 is formed on the first gate spacer 72. The first gate spacer 72 may be formed of a nitride, such as silicon nitride, silicon oxynitride, silicon carbonitride, the like, or a combination thereof, and may be formed using, e.g., a thermal oxidation, chemical vapor deposition (CVD), or other suitable deposition process. The second gate spacer 86 may be formed of silicon nitride, silicon carbonitride, a combination thereof, or the like using a suitable deposition method.

In an embodiment, the gate spacer 85 is formed by first conformally depositing a first gate spacer layer over the FinFET device 100, then conformally depositing a second gate spacer layer over the deposited first gate spacer layer. Next, an anisotropic etch process, such as a dry etch process, is performed to remove a first portion of the second gate spacer layer disposed on upper surfaces of the FinFET device 100 (e.g., the upper surface of the mask 70) while keeping a second portion of the second gate spacer layer disposed along sidewalls of the gate structures. The second portion of the second gate spacer layer remaining after the anisotropic etch process forms the second gate spacer 86. The anisotropic etch process also removes a portion of the first gate spacer layer disposed outside of the sidewalls of the second gate spacer 86, and the remaining portion of the first gate spacer layer forms the first gate spacer 72.

The shapes and formation methods of the gate spacer 85 as illustrated in FIG. 6 are merely non-limiting examples, and other shapes and formation methods are possible. These and other variations are fully intended to be included within the scope of the present disclosure.

Figure 7:
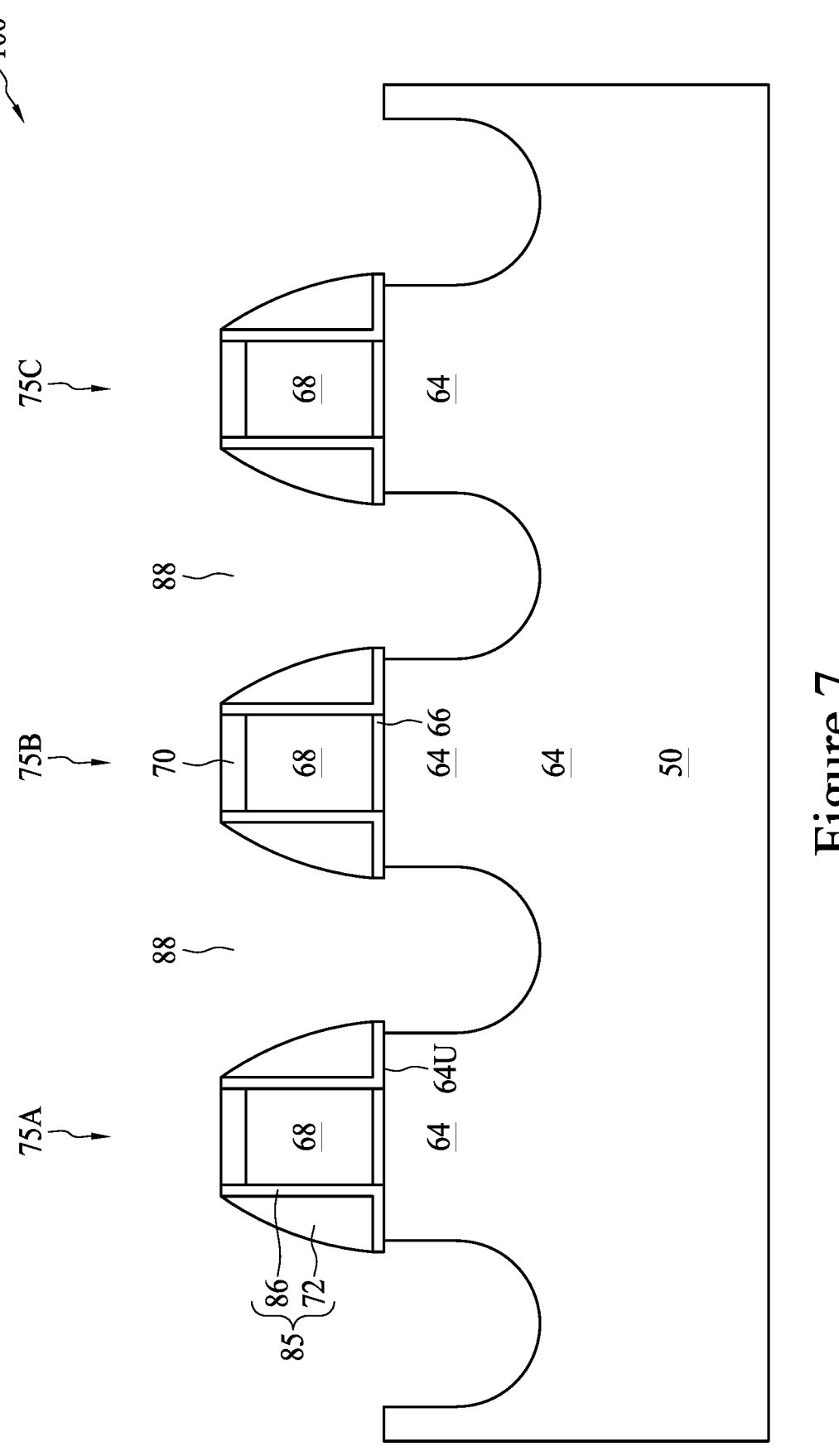

Next, as illustrated in FIG. 7, recesses 88 are formed in the fins 64 adjacent to the dummy gate structures 75, e.g., between adjacent dummy gate structures 75 and/or next to a dummy gate structure 75. The recesses 88 are formed by, e.g., an anisotropic etching process using the dummy gate structures 75 and the gate spacers 85 as an etching mask, in some embodiments, although any other suitable etching process may also be used.

Figure 8A:
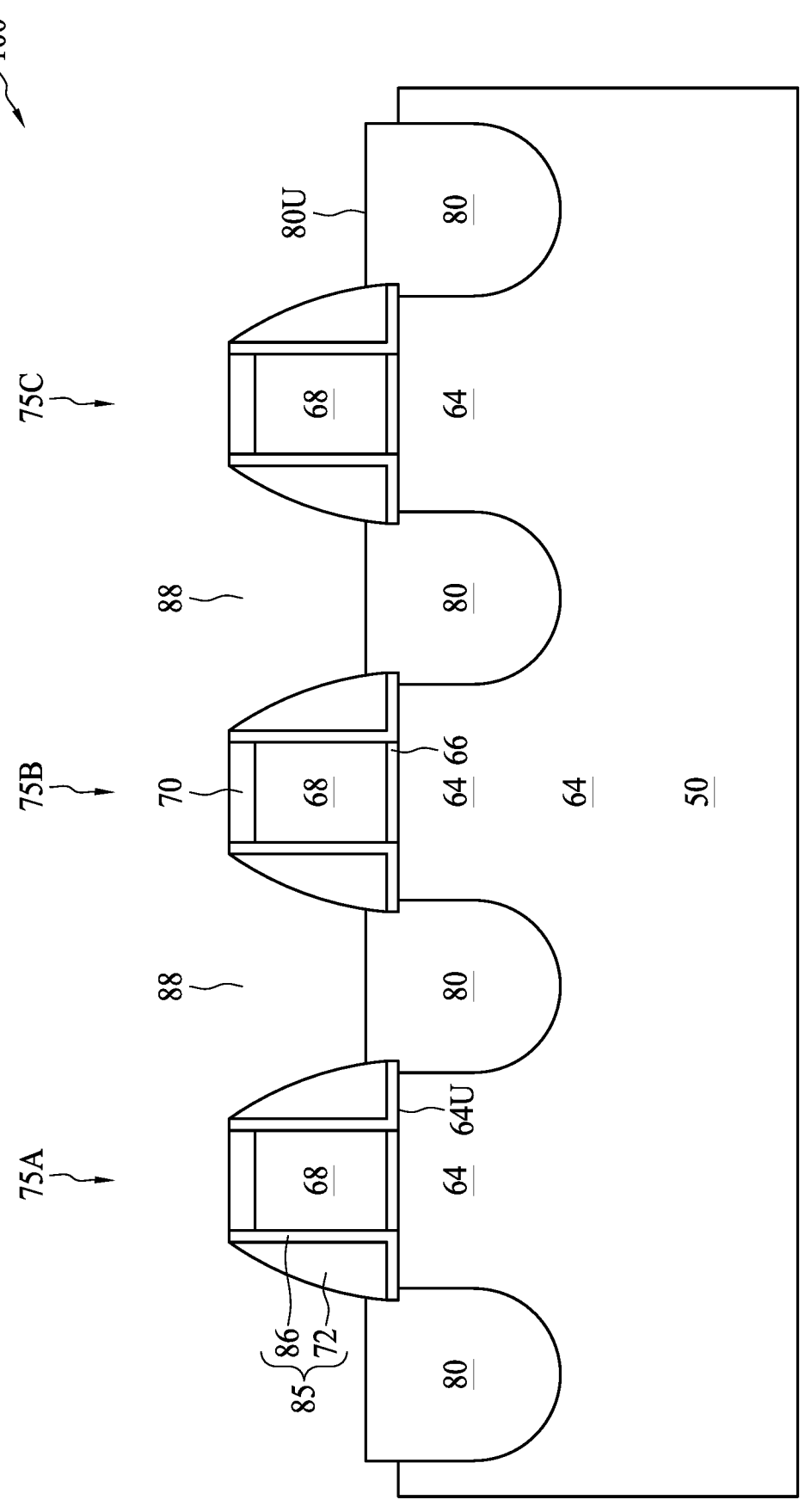
Figure 8B:
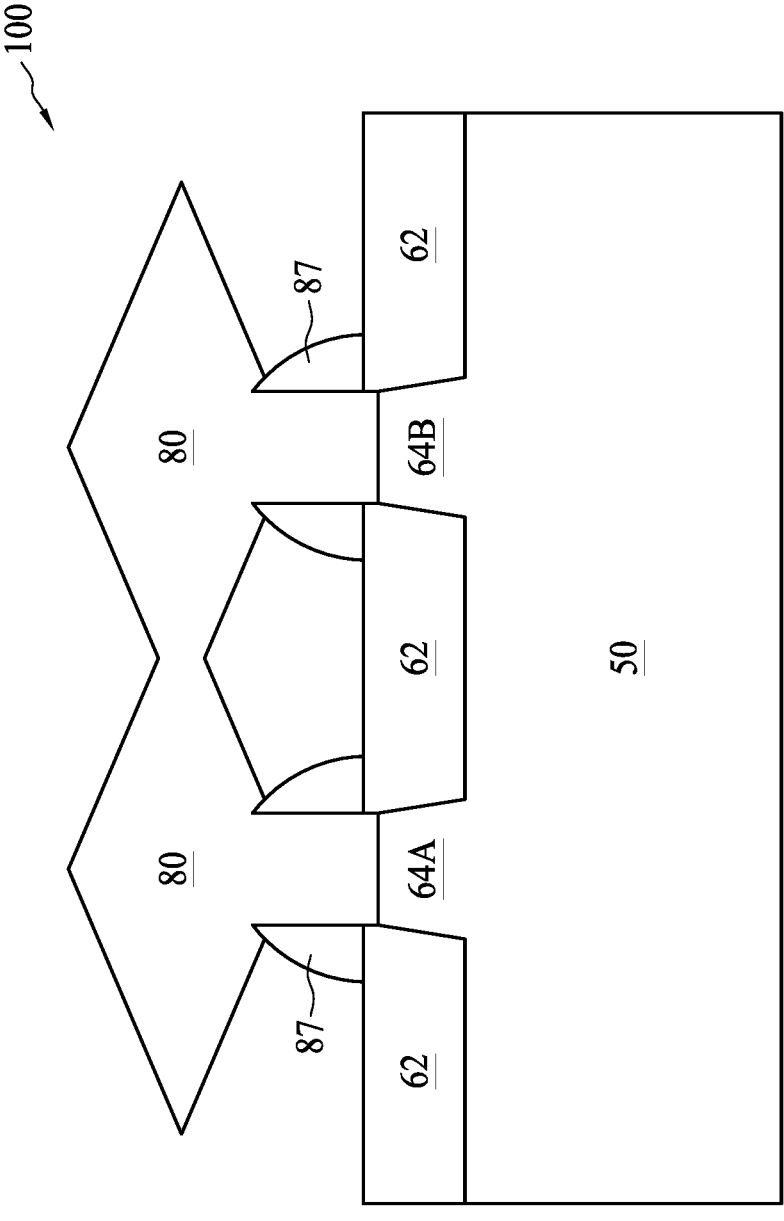
Figure 8C:
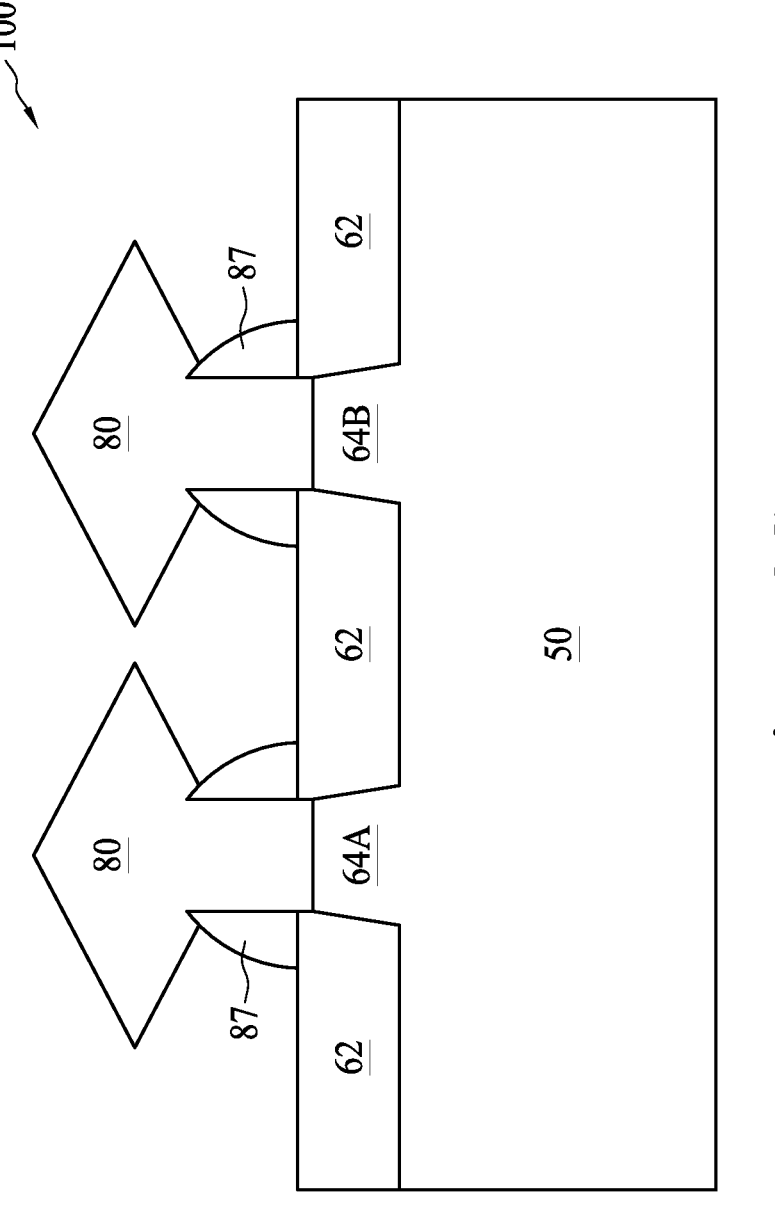

Next, as illustrated in FIG. 8A, the source/drain regions 80 are formed in the recesses 88. In the discussion herein, source/drain region(s) may refer to a source or a drain, individually or collectively dependent upon the context. The source/drain regions 80 are formed by epitaxially growing a material in the recesses 88, using suitable methods such as metal-organic CVD (MOCVD), molecular beam epitaxy (MBE), liquid phase epitaxy (LPE), vapor phase epitaxy (VPE), selective epitaxial growth (SEG), the like, or a combination thereof.

As illustrated in FIG. 8A, the epitaxial source/drain regions 80 may have surfaces raised from respective surfaces of the fins 64 (e.g. raised above the non-recessed upper surface 64U of the fins 64) and may have facets. The source/drain regions 80 of the adjacent fins 64 may merge to form a continuous epitaxial source/drain region 80 (see FIG. 8B). In some embodiments, the source/drain regions 80 of the adjacent fins 64 do not merge together and remain separate source/drain regions 80 (see FIG. 8C). Subsequent cross-sectional figures along cross-section C-C use the example of FIG. 8B as a non-limiting example. In some embodiments, the resulting FinFET is an N-type FinFET, and source/drain regions 80 comprise silicon carbide (SiC), silicon phosphorous (SiP), phosphorous-doped silicon carbon (SiCP), or the like. In some embodiments, the resulting FinFET is a P-type FinFET, and source/drain regions 80 comprise SiGe, and a P-type impurity such as boron or indium.

The epitaxial source/drain regions 80 may be implanted with dopants to form source/drain regions 80 followed by an anneal process. The implanting process may include forming and patterning masks such as a photoresist to cover the regions of the FinFET device 100 that are to be protected from the implanting process. The source/drain regions 80 may have an impurity (e.g., dopant) concentration in a range from about 1E19 cm$^{-3}$ to about 1E21 cm$^{-3}$. P-type impurities, such as boron or indium, may be implanted in the source/drain region 80 of a P-type transistor. N-type impurities, such as phosphorous or arsenide, may be implanted in the source/drain regions 80 of an N-type transistor. In some embodiments, the epitaxial source/drain regions may be in situ doped during growth.

Figure 9:
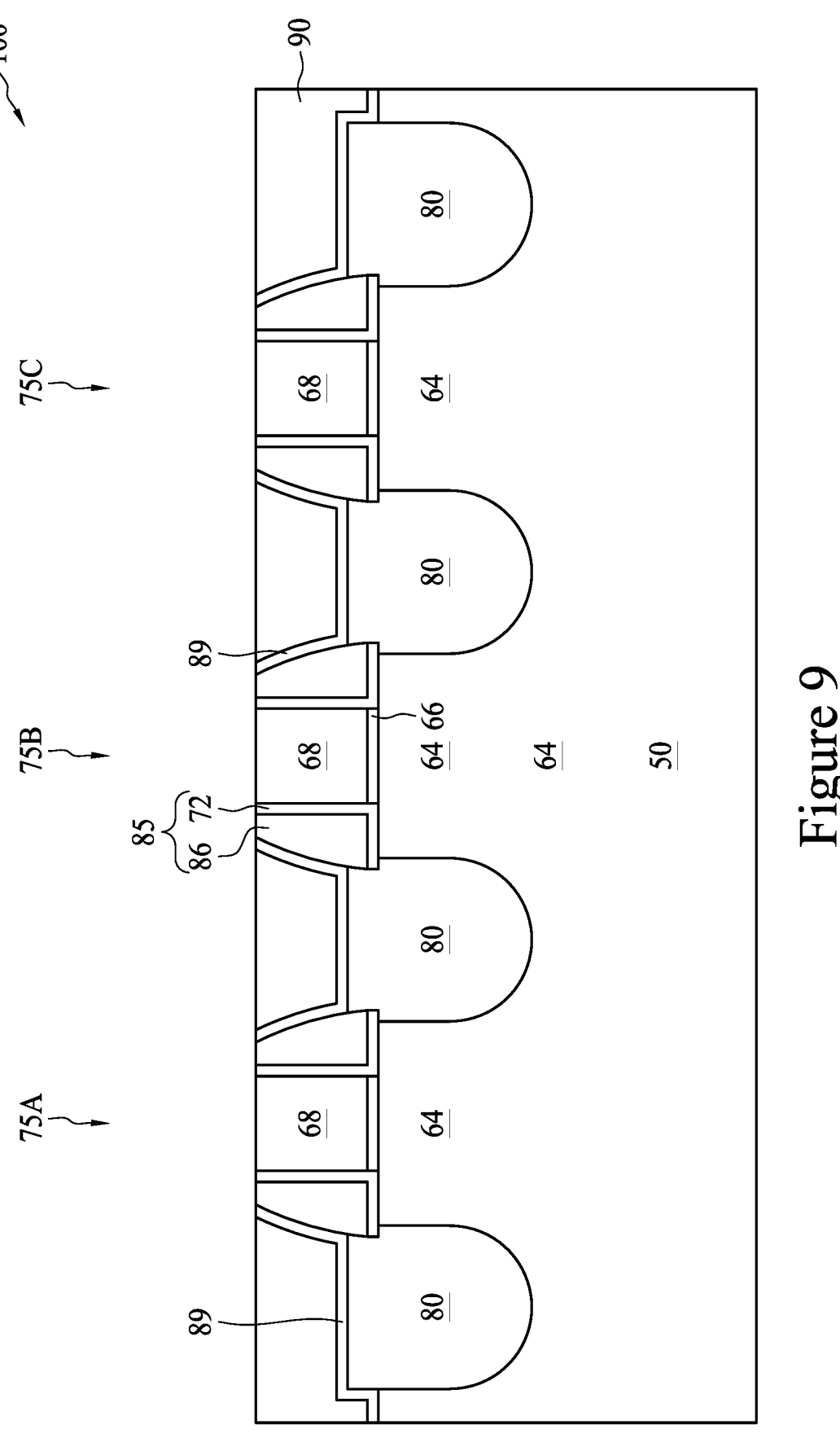

Next, as illustrated in FIG. 9, a contact etch stop layer (CESL) 89 is formed over the structure illustrated in FIG.

8A. The CESL 89 functions as an etch stop layer in a subsequent etching process, and may comprise a suitable material such as silicon oxide, silicon nitride, silicon oxynitride, combinations thereof, or the like, and may be formed by a suitable formation method such as CVD, physical vapor deposition (PVD), combinations thereof, or the like.

Next, a first interlayer dielectric (ILD) 90 is formed over the CESL 89 and over the dummy gate structures 75 (e.g., 75A, 75B, and 75C). In some embodiments, the first ILD 90 is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. A planarization process, such as a CMP process, may be performed to remove the mask 70 and to remove portions of the CESL 89 disposed over the gate electrode 68. After the planarization process, the top surface of the first ILD 90 is level with the top surface of the gate electrode 68.

Figure 10A:
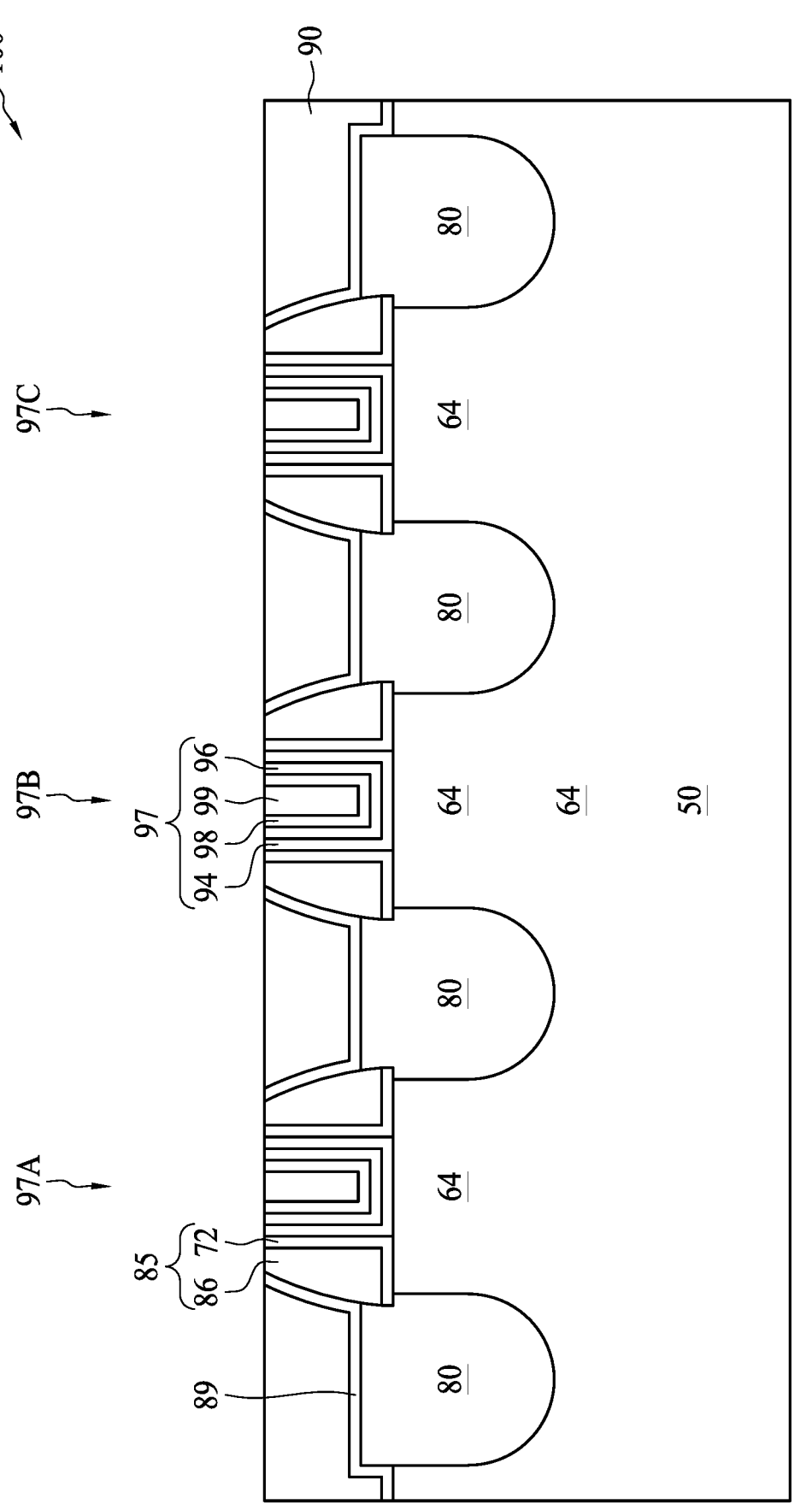

Next, in FIG. 10A, an embodiment gate-last process (sometimes referred to as replacement gate process) is performed to replace the gate electrode 68 and the gate dielectric 66 with an active gate (may also be referred to as a replacement gate or a metal gate) and active gate dielectric material(s), respectively. Therefore, the gate electrode 68 and the gate dielectric 66 may be referred to as dummy gate electrode and dummy gate dielectric, respectively, in a gate-last process. The active gate is a metal gate, in some embodiments.

Referring to FIG. 10A, the dummy gate structures 75A, 75B, and 75C (see FIG. 9) are replaced by replacement gate structures 97A, 97B, and 97C, respectively. In accordance with some embodiments, to form the replacement gate structures 97 (e.g., 97A, 97B, or 97C), the gate electrode 68 and the gate dielectric 66 directly under the gate electrode 68 are removed in an etching step(s), so that recesses (not shown) are formed between the gate spacers 85. Each recess exposes the channel region of a respective fin 64. During the dummy gate removal, the gate dielectric 66 may be used as an etch stop layer when the gate electrode 68 is etched. The gate dielectric 66 may then be removed after the removal of the gate electrode 68.

Next, a gate dielectric layer 94, a barrier layer 96, a work function layer 98, and a gate electrode 99 are formed in the recesses for the replacement gate structure 97. The gate dielectric layer 94 is deposited conformally in the recesses, such as on the top surfaces and the sidewalls of the fins 64 and on sidewalls of the gate spacers 85, and on a top surface of the first ILD 90 (not shown). In accordance with some embodiments, the gate dielectric layer 94 comprises silicon oxide, silicon nitride, or multilayers thereof. In other embodiments, the gate dielectric layer 94 includes a high-k dielectric material, and in these embodiments, the gate dielectric layers 94 may have a k value greater than about 7.0, and may include a metal oxide or a silicate of Hf, Al, Zr, La, Mg, Ba, Ti, Pb, and combinations thereof. The formation methods of gate dielectric layer 94 may include molecular beam deposition (MBD), atomic layer deposition (ALD), PECVD, and the like.

Next, the barrier layer 96 is formed conformally over the gate dielectric layer 94. The barrier layer 96 may comprise an electrically conductive material such as titanium nitride, although other materials, such as tantalum nitride, titanium, tantalum, or the like, may alternatively be utilized. The barrier layer 96 may be formed using a CVD process, such as PECVD. However, other alternative processes, such as sputtering, metal organic chemical vapor deposition (MOCVD), or ALD, may alternatively be used.

Next, the work function layer 98, such as a P-type work function layer or an N-type work function layer, may be formed in the recesses over the barrier layers 96 and before the gate electrode 99 is formed, in some embodiments. Exemplary P-type work function metals that may be included in the gate structures for P-type devices include TiN, TaN, Ru, Mo, Al, WN, $ZrSi_2$, $MoSi_2$, $TaSi_2$, $NiSi_2$, WN, other suitable P-type work function materials, or combinations thereof. Exemplary N-type work function metals that may be included in the gate structures for N-type devices include Ti, Ag, TaAl, TaAlC, TiAlN, TaC, TaCN, TaSiN, Mn, Zr, other suitable N-type work function materials, or combinations thereof. A work function value is associated with the material composition of the work function layer, and thus, the material of the work function layer is chosen to tune its work function value so that a target threshold voltage Vt is achieved in the device that is to be formed. The work function layer(s) may be deposited by CVD, PVD, ALD, and/or other suitable process.

Next, a seed layer (not shown) is formed conformally over the work function layer 98. The seed layer may include copper, titanium, tantalum, titanium nitride, tantalum nitride, the like, or a combination thereof, and may be deposited by ALD, sputtering, PVD, or the like. In some embodiments, the seed layer is a metal layer, which may be a single layer or a composite layer comprising a plurality of sub-layers formed of different materials. For example, the seed layer comprises a titanium layer and a copper layer over the titanium layer.

Next, the gate electrode 99 is deposited over the seed layer, and fills the remaining portions of the recesses. The gate electrode 99 may be made of a metal-containing material such as Cu, Al, W, the like, combinations thereof, or multi-layers thereof, and may be formed by, e.g., electroplating, electroless plating, or other suitable method. After the formation of the gate electrode 99, a planarization process, such as a CMP, may be performed to remove the excess portions of the gate dielectric layer 94, the barrier layer 96, the work function layer 98, the seed layer, and the gate electrode 99, which excess portions are over the top surface of the first ILD 90. The resulting remaining portions of the gate dielectric layer 94, the barrier layer 96, the work function layer 98, the seed layer, and the gate electrode 99 thus form the replacement gate structure 97 of the resulting FinFET device 100.

Figure 10B:

FIG. 10B shows the FinFET device 100 of FIG. 10A, but along cross-section C-C. In the example of FIG. 10B, a void region 82 (e.g., an empty space) is formed below the merged portion of the source/drain regions 80. In embodiments where the source/drain regions 80 do not merge (e.g., remain separated), the first ILD 90 fills (e.g., partially fills or completely fills) the space corresponding to the void region 82 of FIG. 10B.

Figure 11A:
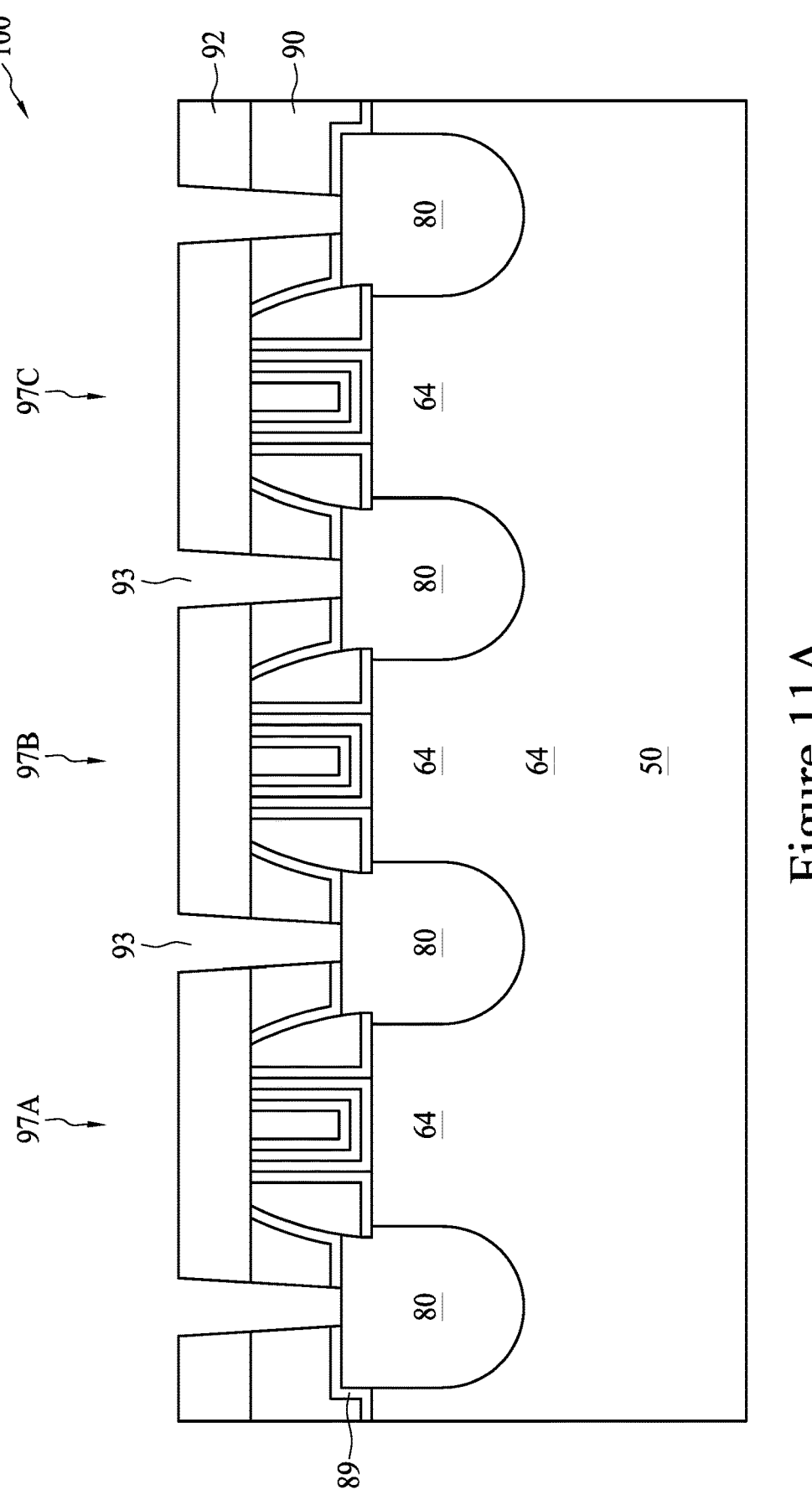

Referring next to FIG. 11A, a second ILD 92 is formed over the first ILD 90. Openings 93 are formed through the second ILD 92 and the first ILD 90 to expose the source/drain regions 80.

In an embodiment, the second ILD 92 is a flowable film formed by a flowable CVD method. In some embodiments, the second ILD 92 is formed of a dielectric material such as PSG, BSG, BPSG, USG, or the like, and may be deposited by any suitable method, such as CVD and PECVD. In some embodiments, the second ILD 92 and the first ILD 90 are formed of a same material. In some embodiments, the second ILD 92 and the first ILD 90 are formed of different materials.

In some embodiments, the openings 93 in FIG. 11A are formed using photolithography and etching. The etching process etches through the CESL 89 to expose the source/drain regions 80. In some embodiments, the openings 93 in FIG. 11A are formed using an anisotropic etching process, such as an anisotropic plasma etching process.

Figure 11B:
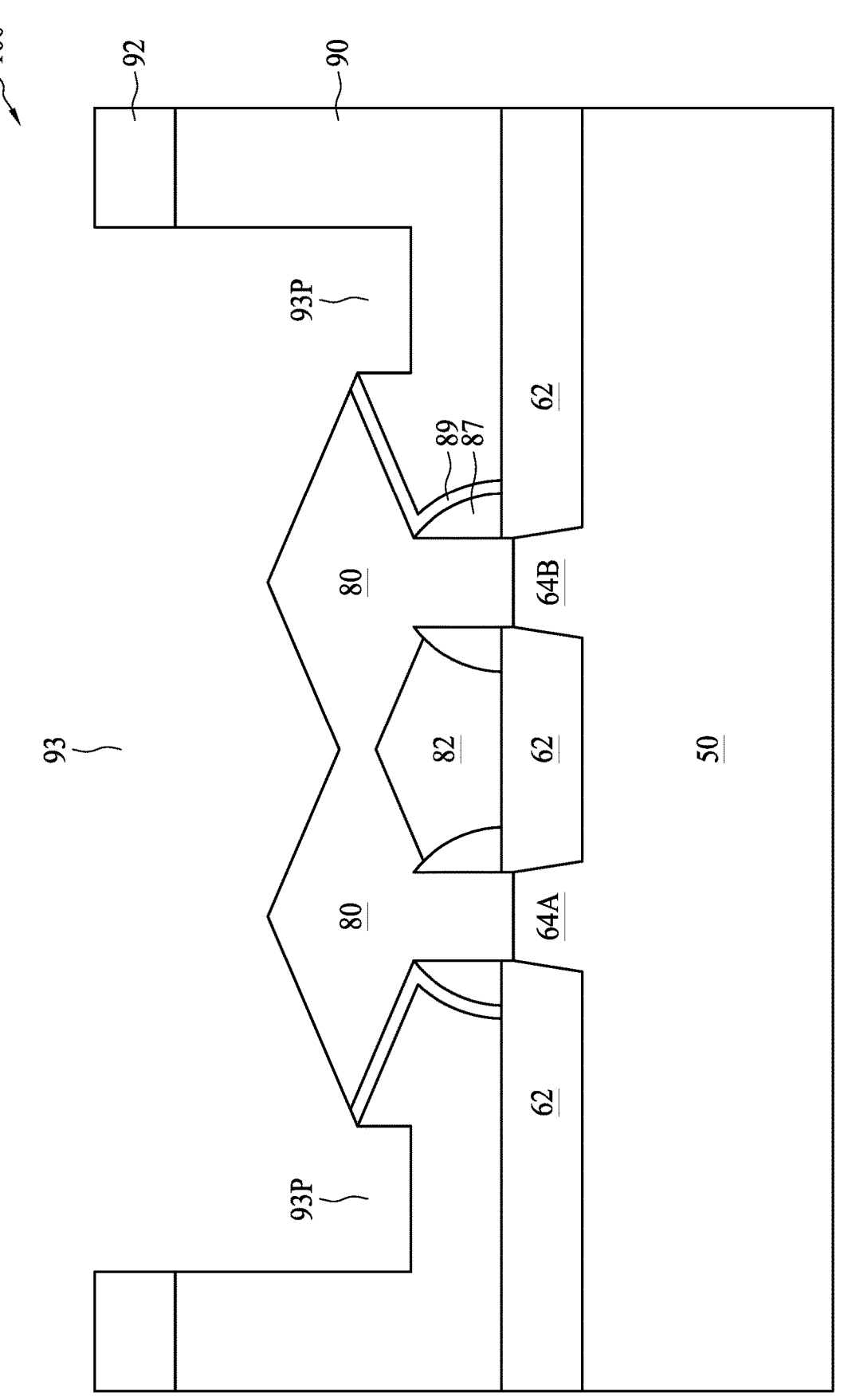

FIG. 11B shows the FinFET device 100 of FIG. 11A, but along cross-section C-C. As illustrated in FIG. 11B, the CESL 89 over the upper surfaces of the source/drain regions 80 is removed. The opening 93 in the illustrated embodiments is a narrow trench between the replacement gate structures 97 or adjacent to a replacement gate structure 97. The narrow trench extends parallel to the replacement gate structure 97, in the illustrated embodiments. As shown in FIG. 11B, the opening 93 (also referred to as a trench) is wider than the source/drain regions 80 in the cross-section C-C, and includes protrusion portions 93P that are disposed laterally between the source/drain regions 80 and the first ILD 90. The protrusion portions 93P of the opening 93 extend deeper into the first ILD 90 than other portions of the opening 93, and may be formed because the etching process to form the openings 93 has an etching selectivity between the source/drain regions 80 and the first ILD 90. For example, the etching process may be selective to (e.g., having a higher etch rate for) the material of the first ILD 90.

Figure 12:
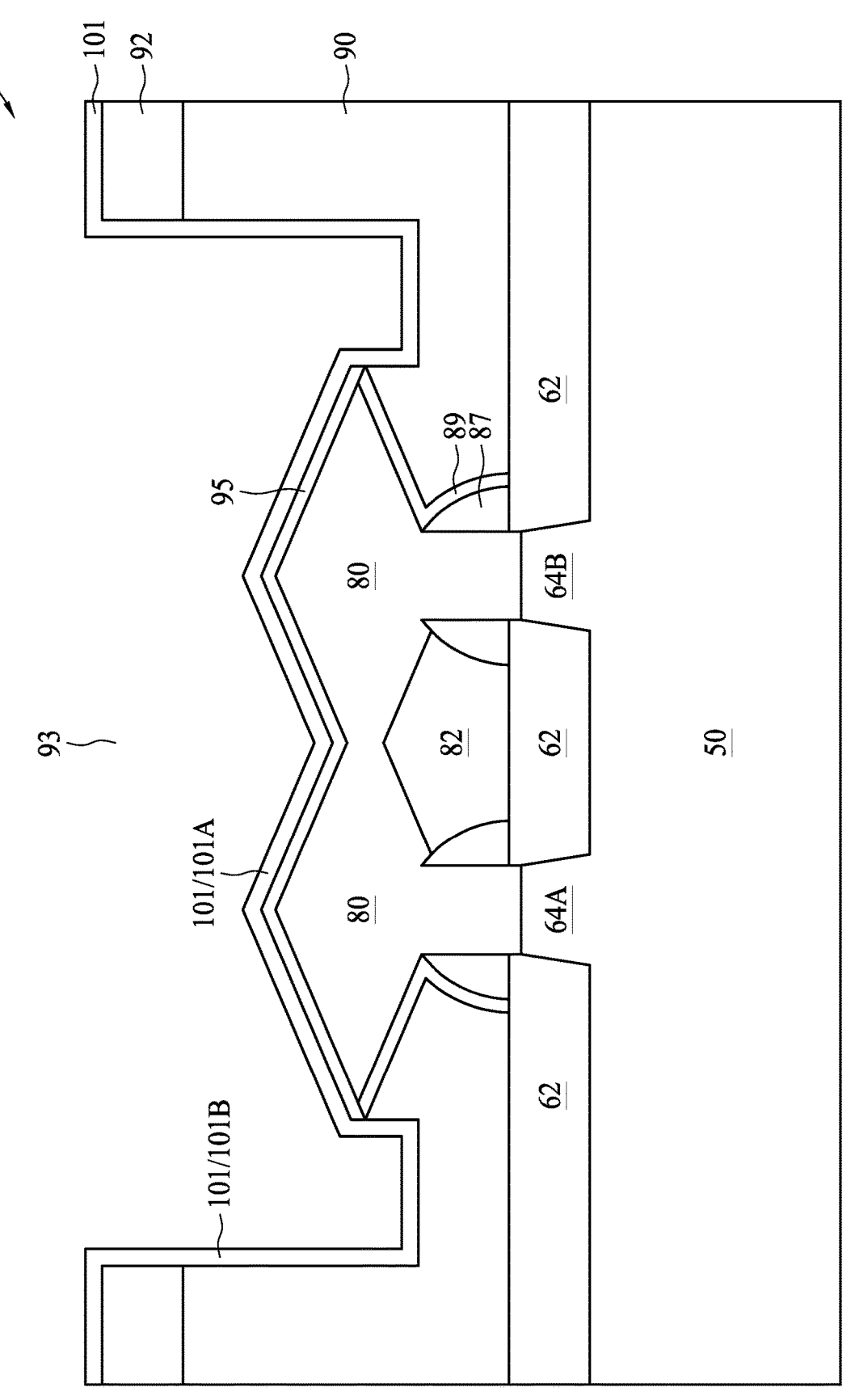

Next, in FIG. 12, silicide regions 95 are formed on the source/drain regions 80, and a barrier layer 101 is formed (e.g., conformally) in the openings 93, e.g., on the silicide regions 95 and along bottoms and sidewalls of the openings 93. In an embodiment, the silicide regions 95 are formed by a CVD process using a gas source comprising titanium tetrachloride ($TiCl_4$) and $H_2$, e.g., through chemical reaction between $TiCl_4$ gas and $H_2$ plasma. The chemical reaction between $TiCl_4$ gas and $H_2$ plasma produces titanium, which is deposited in the openings 93, e.g., on the source/drain regions 80 and along the bottoms and sidewalls of the openings 93. The titanium deposited on the source/drain regions 80 reacts with the material (e.g., Si) of the source/drain regions 80 to form titanium silicide (e.g., TiSi) as the silicide regions 95, e.g., under the high temperature of the CVD process, or by an additional thermal process. A thickness of the silicide regions 95 may be between about 5 angstroms and about 30 angstroms, as an example.

Next, a plasma process is performed to treat the silicide regions 95 using $NH_3$ plasma. The plasma process may be used to prevent oxidization of the silicide regions 95. The barrier layer 101 is formed as a result of the plasma process. In the illustrated embodiments, the plasma process treats upper portions (e.g., surface portions) of the silicide regions 95, and does not treat bottom portions of the silicide regions 95 or the source/drain regions 80. In some embodiments, the $NH_3$ plasma reacts with upper portions of the silicide regions 95 (e.g., TiSi) to form titanium silicon nitride (e.g., TiSiN). The $NH_3$ plasma may also react with silicon elements, e.g., silicon elements out-diffused from the source/drain regions 80, to form silicon nitride (e.g., SiN) at the surfaces of the silicide regions 95. The $NH_3$ plasma may additionally react with titanium (un-reacted portion after forming silicide regions 95) on the source/drain regions 80 to form titanium nitride (e.g., TiN). Therefore, a portion of the barrier layer 101 over the source/drain regions 80, labeled as 101A, comprises TiSiN, TiN, and SiN. In addition, the $NH_3$ plasma may also react with the titanium deposited along the bottoms and sidewalls of the openings 93 to form titanium nitride (TiN). Therefore, a portion of the barrier layer 101 along the bottoms and the sidewalls of the openings 93, labeled as 101B, comprises TiN. The portion 101B of the barrier layer 101 may additionally comprise TiSiN.

In some embodiments, the molecular percentage (mol %) (which may also be referred to as mole percentage) of SiN in the barrier layer 101 (e.g., in the portion 101A) is high, such as above 16 mol %. Such a high concentration of SiN in the barrier layer 101 may make it difficult to form a seed layer 105 (e.g., a tungsten seed layer) on the barrier layer 101, due to SiN making the surface of the barrier layer 101 un-conducive (e.g., having a low or zero deposition rate) for depositing the seed layer. As discussed below, a surface treatment process is performed to reduce the concentration of SiN in the barrier layer 101 below 16 mol %.

Figure 13:
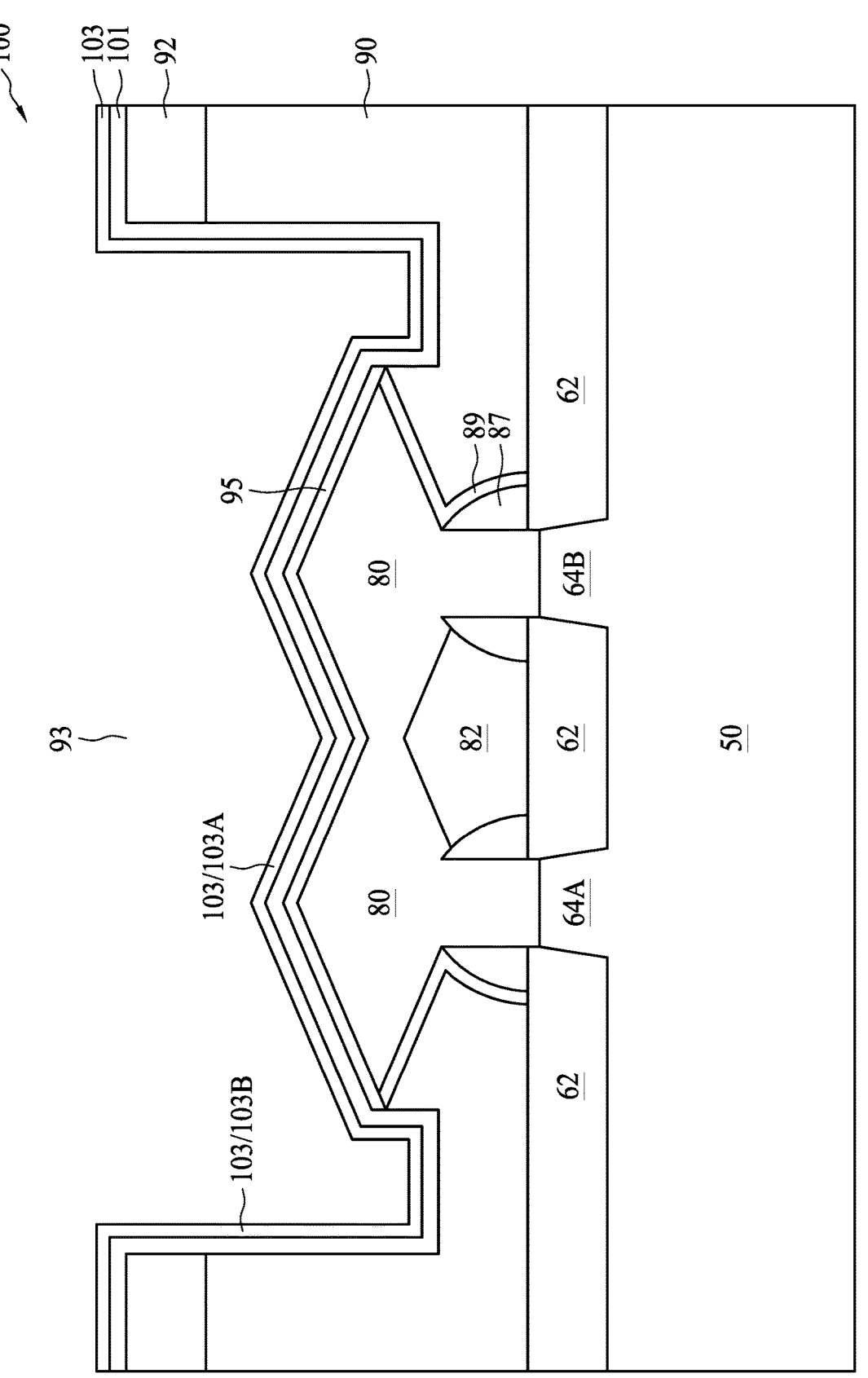

Referring next to FIG. 13, a surface treatment process is performed to treat surface portions of the barrier layer 101 to reduce the concentration of SiN in the barrier layer 101. The surface treatment process converts a surface portion (e.g., a thin sublayer exposed to the openings 93) of the barrier layer 101 into a modified barrier layer 103. The modified barrier layer 103 may have a thickness between about 0 nm and about 3 nm, such as between about 0 angstrom and about 15 angstroms, as an example.

In some embodiments, the surface treatment process is a dry plasma treatment process performed using $H_2$ plasma or Ar plasma. In some embodiments, the surface treatment process is a wet chemical treatment process (also referred to as a wet etch process). The wet chemical treatment process may be an oxidization process performed using diluted hydrofluoric acid (e.g., dHF) or ammonium hydroxide (e.g., $NH_4OH$). In some embodiments, the surface treatment process (e.g., dry plasma treatment process or the wet chemical treatment process) breaks chemical bonds of (the material(s) of) the surface portion of the barrier layer 101. Details are discussed below with reference to FIG. 26.

Figure 26:
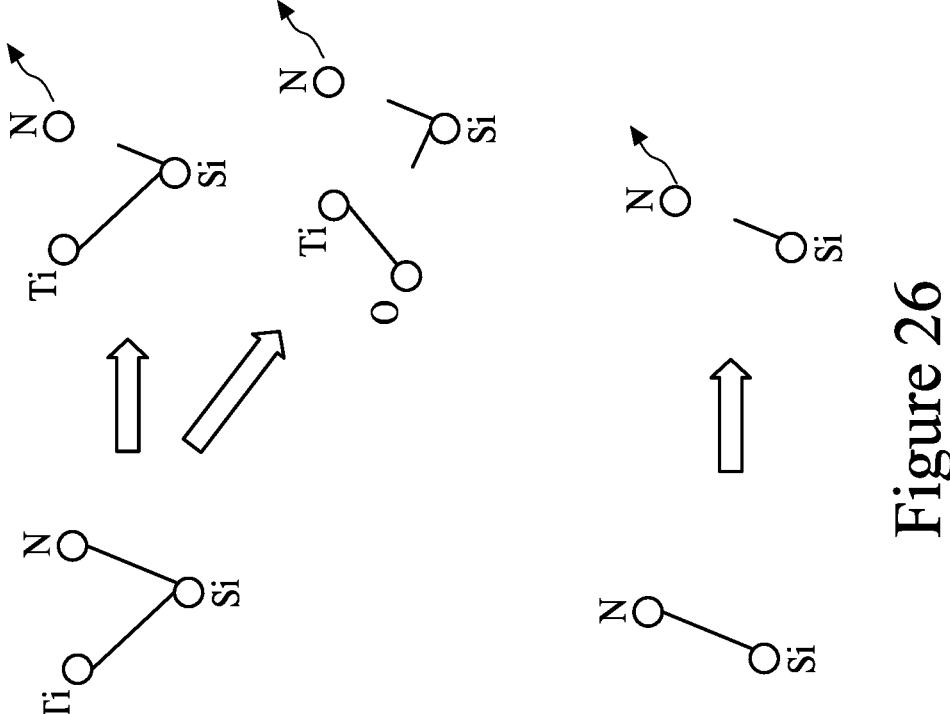
FIG. 26 illustrates the effect of surface treatment on chemical bonds of the barrier layer, in accordance with an embodiment.

Referring temporarily to FIG. 26, which shows the chemical bonds between atoms of the TiSiN material and atoms of SiN material before (on the left side of the arrows) and after (on the right side of the arrows) the surface treatment process. For example, the lower portion of the FIG. 26 shows that for the SiN material (e.g., in the portion 101A of the barrier layer 101), some of the chemical bonds between Si and N atoms are broken, and the N atoms broken from the Si atoms may form volatile product and leave the barrier layer, thereby reducing the concentration of SiN in the modified barrier layer 103. The top portion of FIG. 26 shows that for the TiSiN material (e.g., in the portion 101A of the barrier layer 101), some of the chemical bonds between Si and N atoms are broken. In addition, some of the chemical bond between Si and Ti atoms are also broken, and the Ti atoms from the broken bonds may form new chemical bonds with oxygen (O) atoms (e.g., O in the ambient air) to form titanium oxide (TiO). Therefore, besides reducing the concentration of SiN, another effect of the surface treatment process is that the concentration of TiO in the modified barrier layer 103 is increased. Since TiO is conducive for deposition of the seed layer 105, the increase in the concentration of TiO (e.g., in the portion 103A of the modified barrier layer 103) further improves the deposition rate of the subsequently formed seed layer 105.

Referring back to FIG. 13, a portion 103A of the modified barrier layer 103, which is over (the remaining portion of) the portion 101A of the barrier layer 101, has reduced SiN concentration (e.g., <16 mol %) and increased TiO concentration. A portion 103B of the modified barrier layer 103, which is over (the remaining portion of) the portion 101B of the barrier layer 101, corresponds to the surface portion of the portion 101B after being treated by the surface treatment process.

Figure 14:
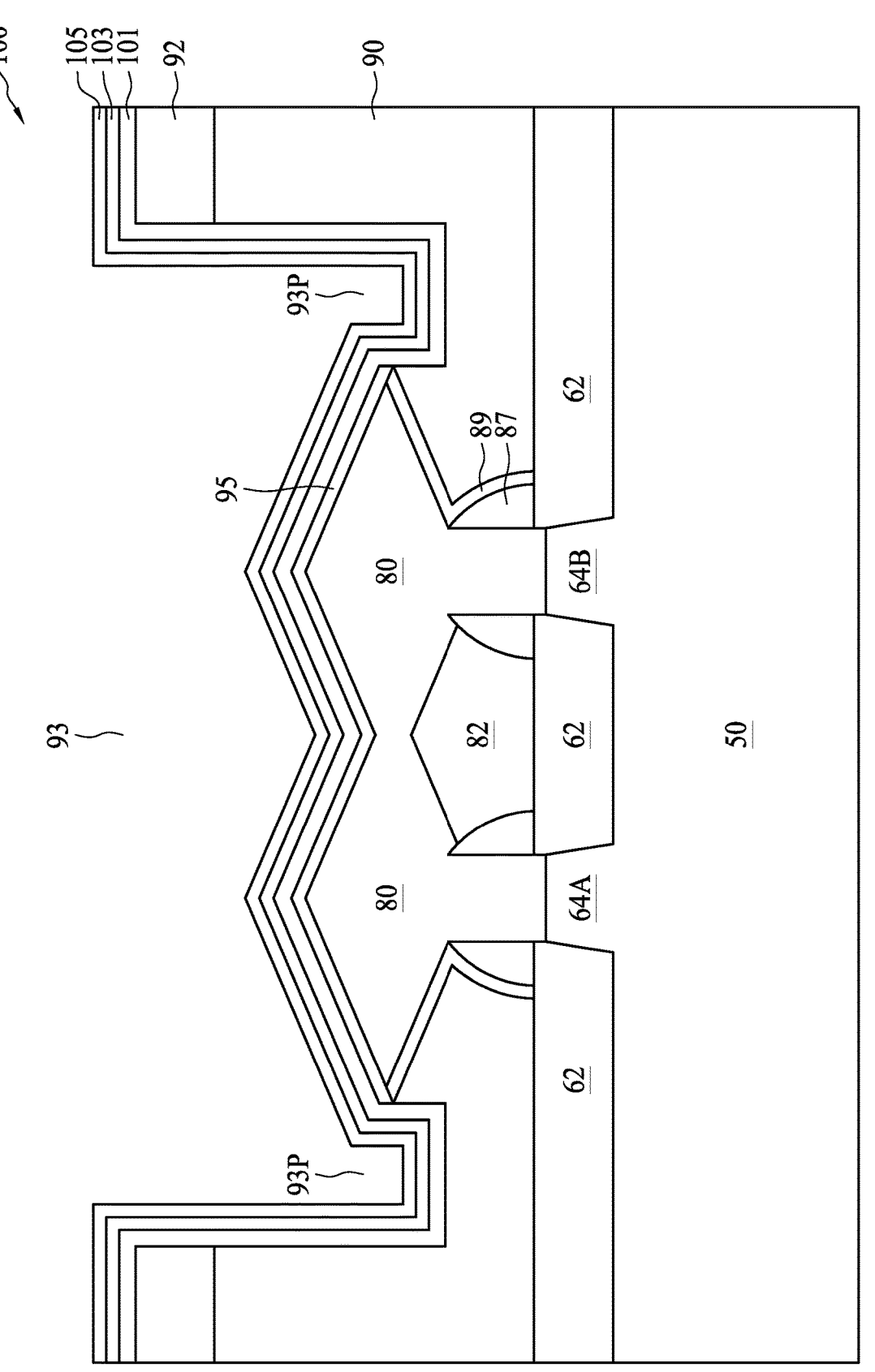

Next, in FIG. 14, the seed layer 105 is formed (e.g., conformally) in the openings 93 over the modified barrier layer 103. In some embodiments, the seed layer 105 is a conformal tungsten layer formed by a CVD-like thermal deposition process performed using $WCl_5$ gas and $H_2$ gas. The $WCl_5$ gas and $H_2$ gas react to form a layer of tungsten as the seed layer 105. In some embodiments, the modified barrier layer 103 is consumed by the thermal deposition process, and after the thermal deposition process, no modified barrier layer 103 is left in the FinFET device 100. In some embodiments, the modified barrier layer 103 remains after the thermal deposition process. The modified barrier layer 103 is shown in subsequent figures, with the understanding that the modified barrier layer 103 may be completely consumed by the thermal deposition process.

Without the disclosed surface treatment process, the protrusion portions 93P of the openings 93 pose a challenge for forming the seed layer 105, because the high SiN concentration in the barrier layer 101, coupled with the geometry of the source/drain regions 80 at their edge regions (referred to as cliff geometry), make it difficult to reliably form the seed layer 105 to cover those regions. Therefore, the seed layer 105 may not be formed in certain regions (e.g., the seed layer having holes), or may be formed with insufficient thickness. In subsequent processing, the seed layer 105 is subject to processing steps such as wet etch and ashing, and therefore, may be damaged (e.g., removed). A seed layer 105 with insufficient thickness or holes may not provide sufficient protection for the silicide regions 95 and/or source/drain regions 80, and therefore, damages to the silicide regions 95 and/or the source/drain regions 80 may occur due to the etching or ashing processes, which increases the electrical resistance of the source/drain contact plugs, or may even results in device failure. The presently disclosure methods, by allowing seed layer 105 to be formed reliably to cover all underlying layers, prevent such performance loss and/or device failure, thereby improving device performance and production yield. Additionally, the seed layer 105 may act as a diffusion barrier layer to prevent diffusion of fluoride in subsequent processing to form the electrically conductive material 109.

Figure 15:
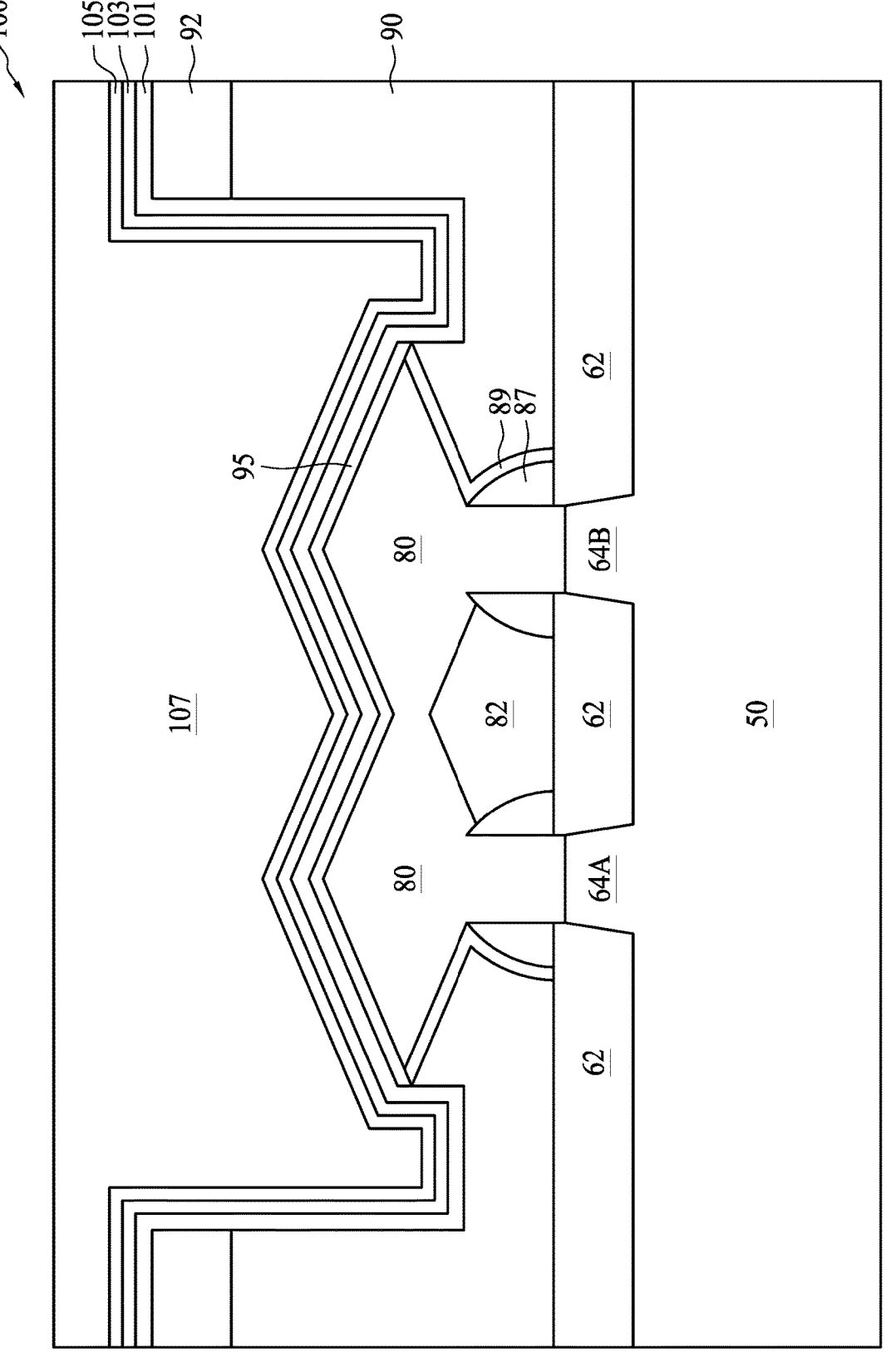

Next, in FIG. 15, a photoresist layer 107 is formed in the openings 93. The photoresist layer 107 may be a bottom anti-reflective coating (BARC) layer, as an example. The photoresist layer 107 may be formed to fill the openings 93 and cover the upper surface of the second ILD 92.

Figure 16:
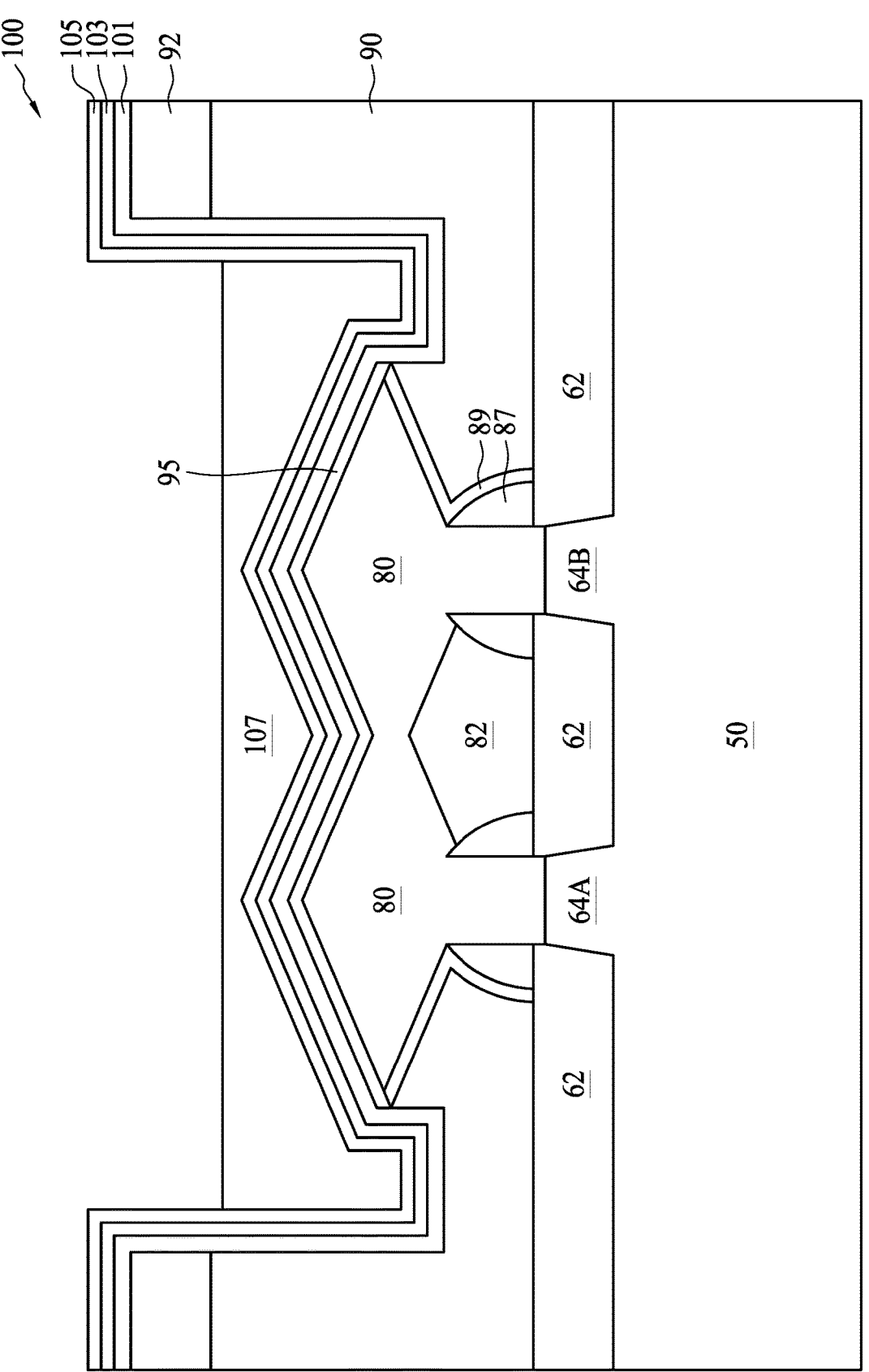

Next, in FIG. 16, the photoresist layer 107 is etched back below the upper surface of the second ILD 92. A suitable etching process, such as dry etch, may be performed to etch back the photoresist layer 107. After the etching process, the upper surface of the photoresist layer 107 may be below the upper surface of the first ILD 90. The recessed photoresist layer 107 exposes upper portions of the seed layer 105, upper portions of the modified barrier layer 103, and upper portions of the barrier layer 101.

Figure 17:
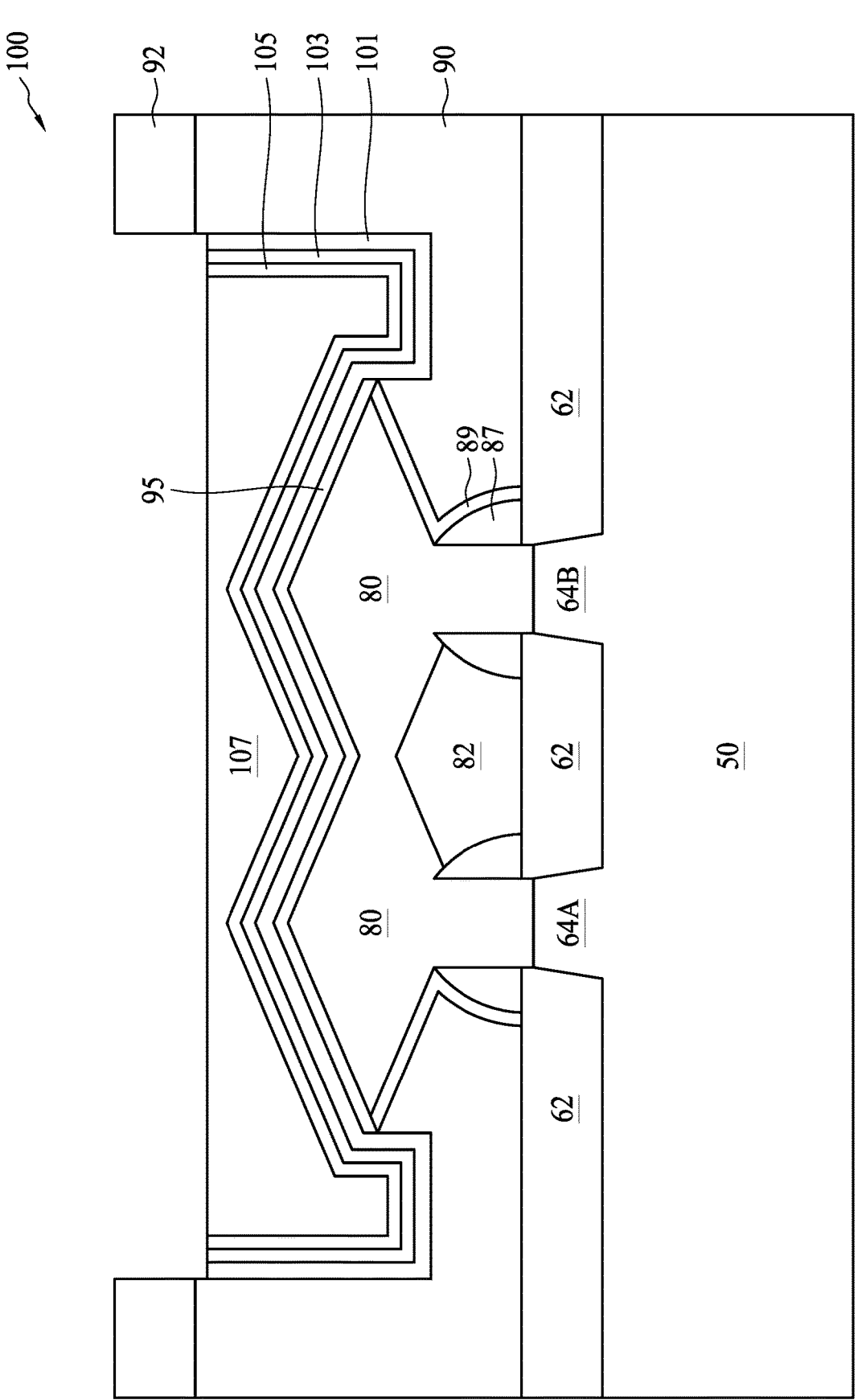

Next, in FIG. 17, the upper portions of the seed layer 105, the upper portions of modified barrier layer 103, and the upper portions of barrier layer 101 disposed above the upper surface of the photoresist layer 107 are removed by an etching process (e.g., a wet etch process). The photoresist layer 107 protects (e.g., shields) the lower portions of the seed layer 105, the lower portions of modified barrier layer 103, and the lower portions of barrier layer 101 from the etching process. After the etching process, sidewalls of the second ILD 92, and upper sidewalls of the first ILD 90 are exposed.

Figure 18:
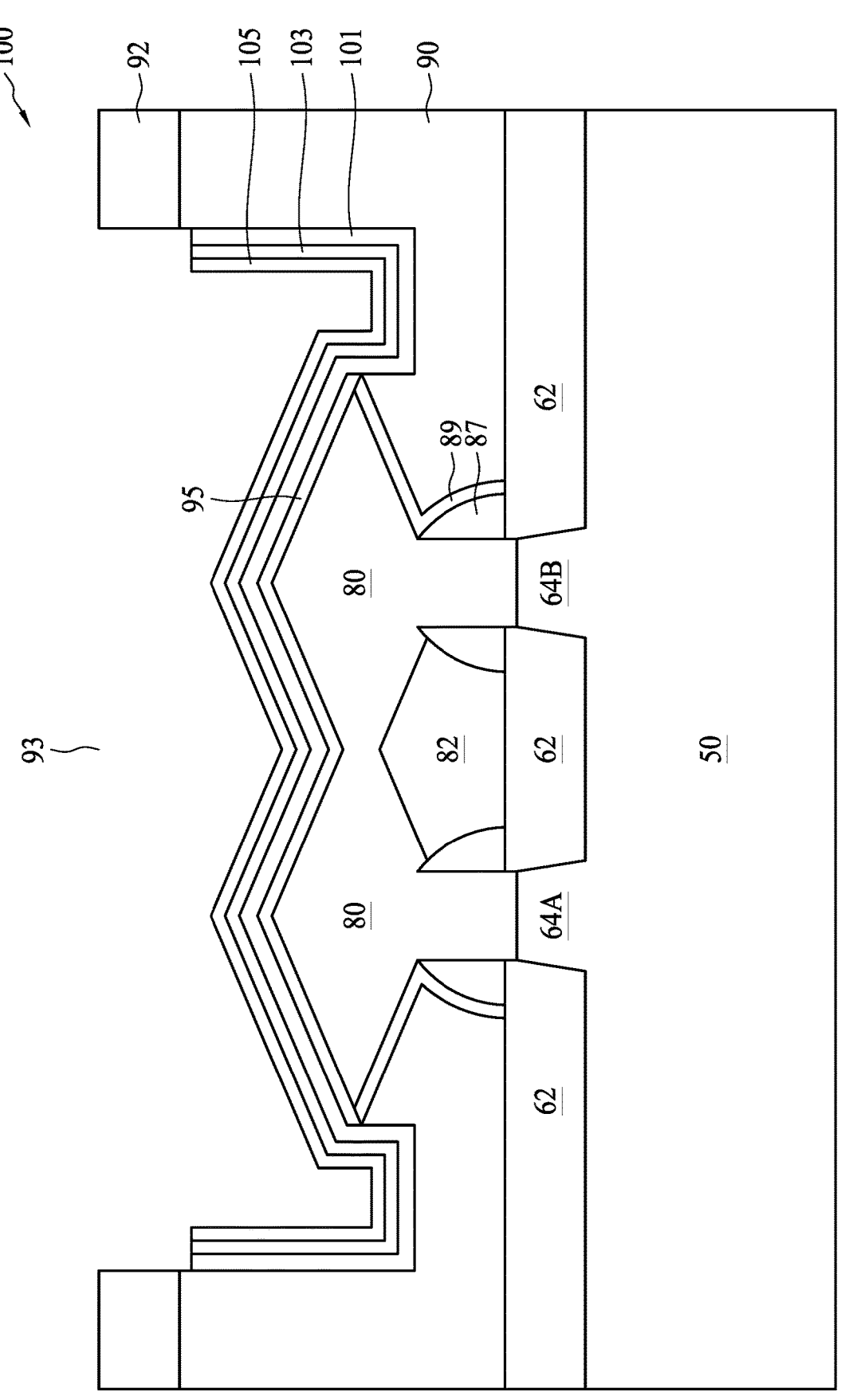

Next, in FIG. 18, the photoresist layer 107 is removed. A suitable removal process, such as ashing, may be performed to remove the photoresist layer 107. After the removal of the photoresist layer 107, the remaining portion of the seed layer 105 is exposed to the opening 93.

Figure 19A:
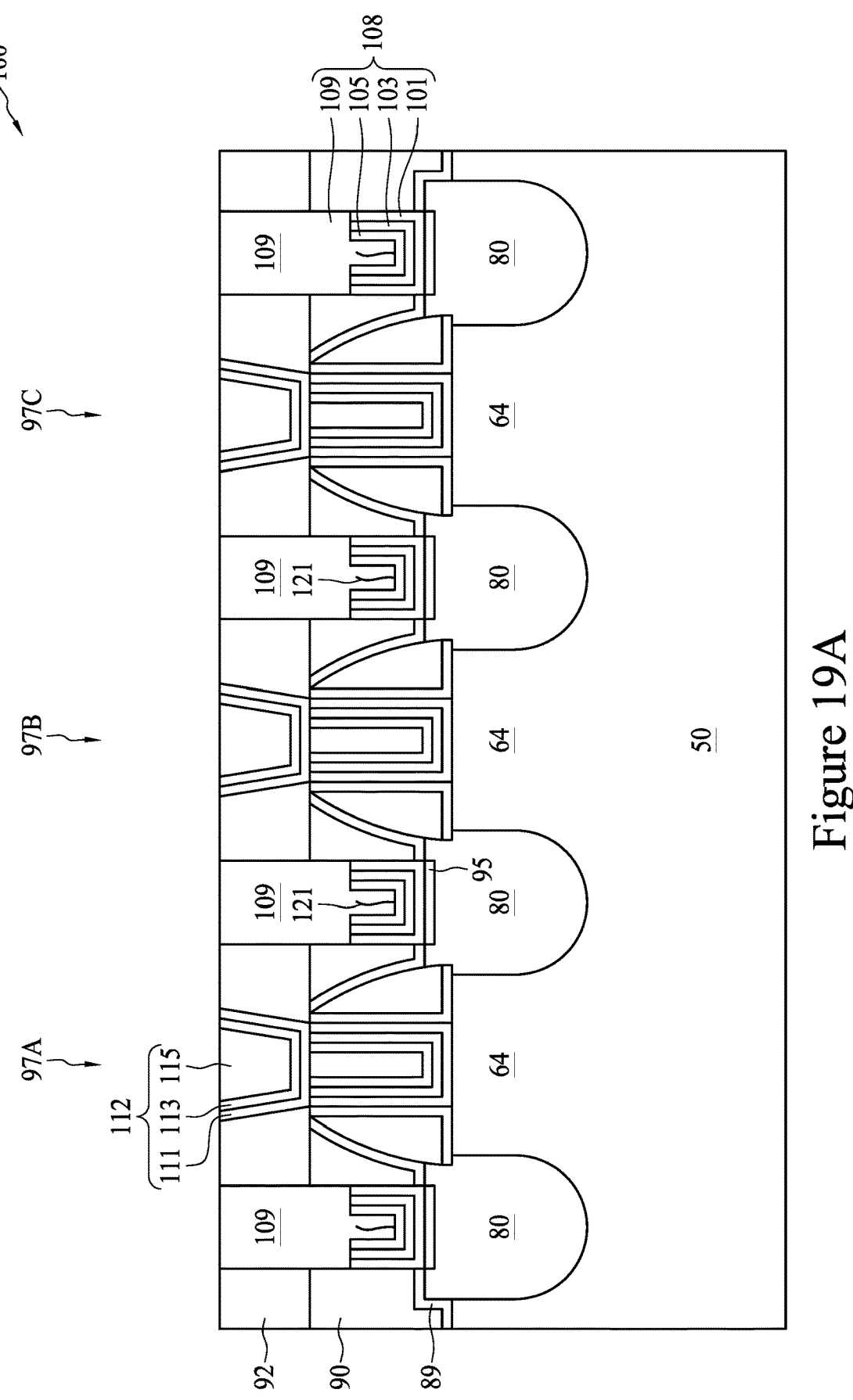
Figure 19B:
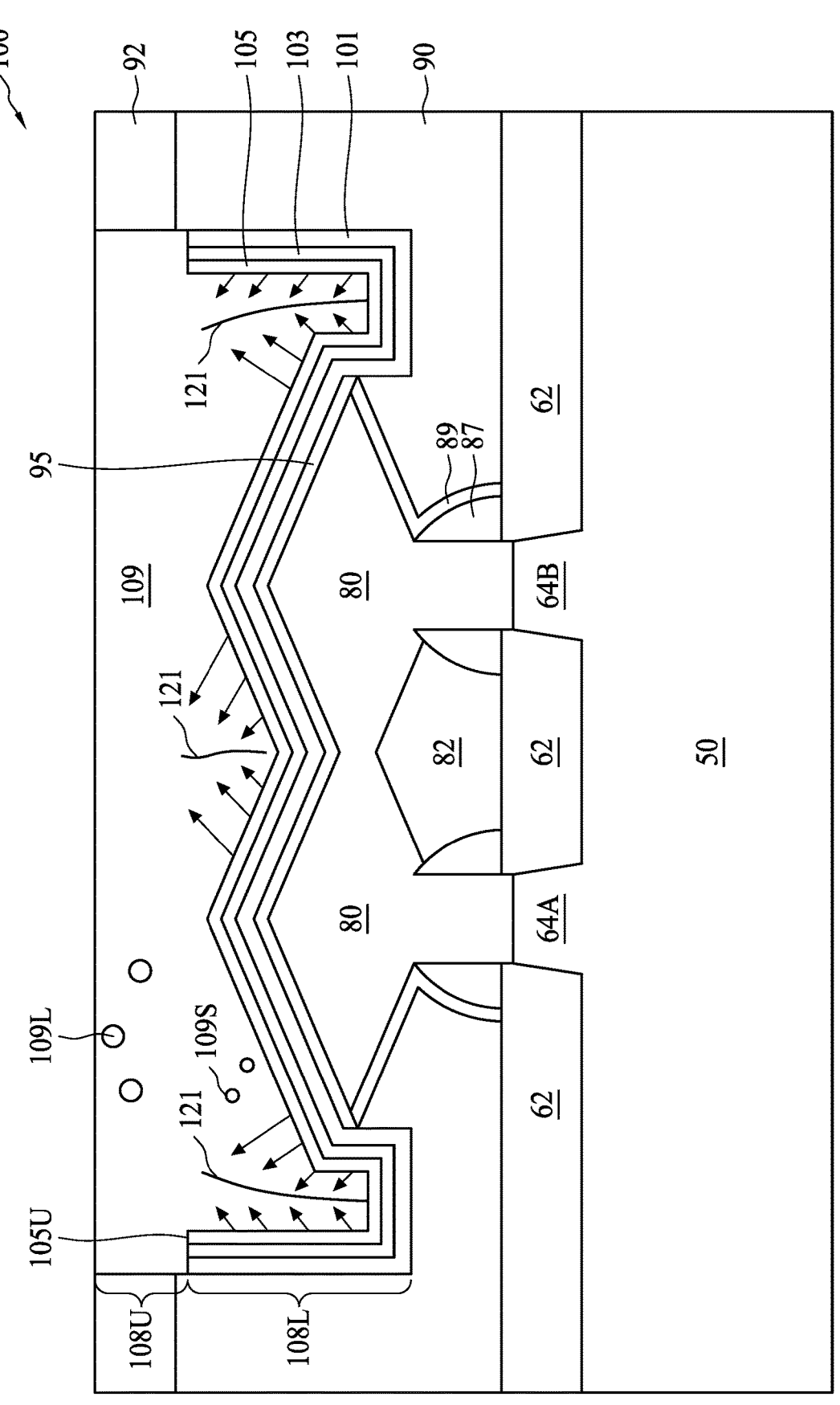
Figure 19C:
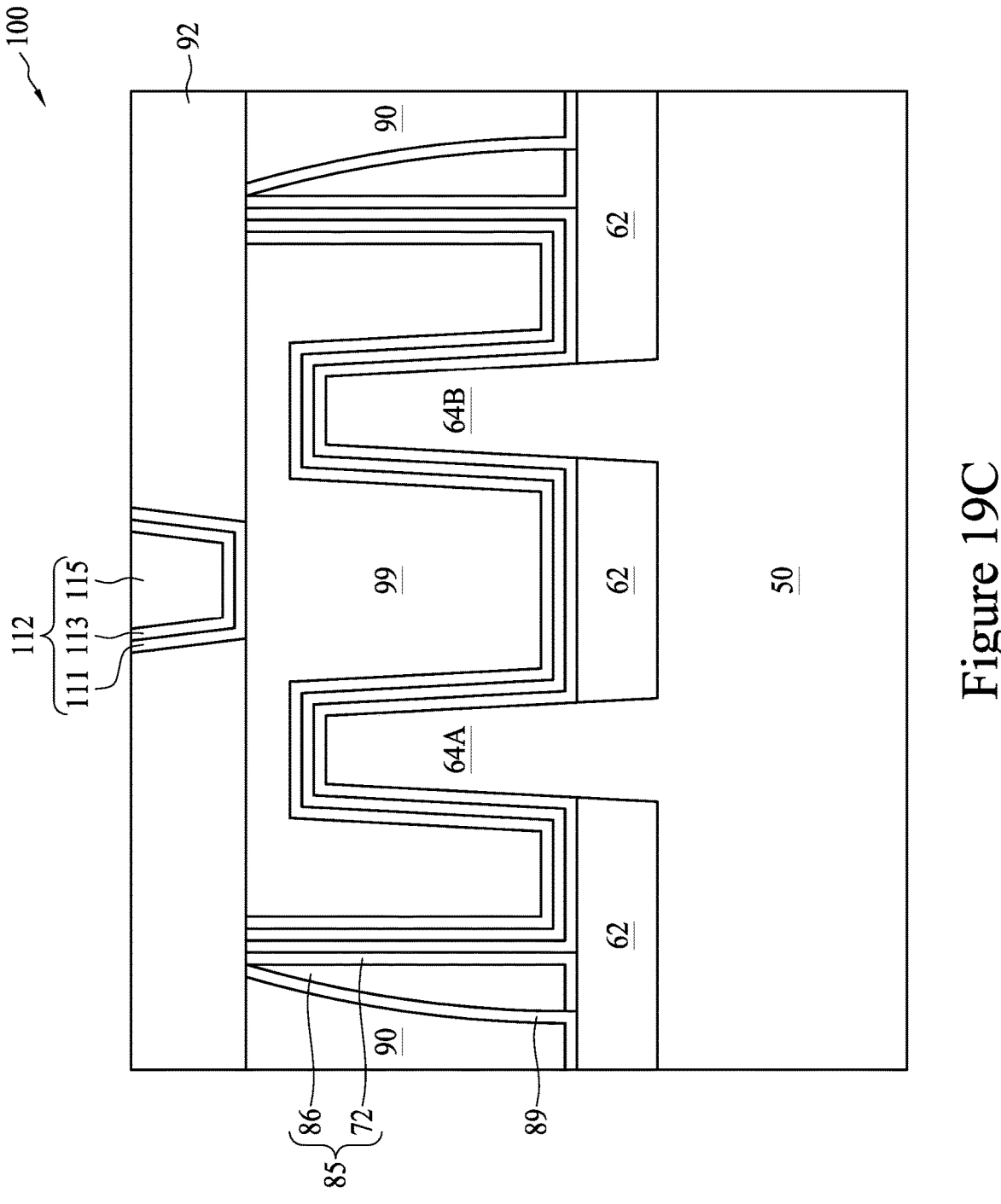

Next, in FIGS. 19A-19C, an electrically conductive material 109 is formed over the seed layer 105 to fill the openings 93. In some embodiments, the electrically conductive material 109 is a tungsten layer formed by a CVD-like thermal deposition process performed using $WF_6$ gas and $H_2$ gas. The $WF_6$ gas and $H_2$ gas react to form a layer of tungsten in the openings 93. The electrically conductive material 109 (e.g., W) fills the openings 93 and may cover the upper surface of the second ILD 92. Next, a planarization process, such as CMP, may be performed to remove excess portions of the electrically conductive material 109 from the upper surface of the second ILD 92. The remaining portions of the electrically conductive material 109 in the openings 93, the seed layer 105, the modified barrier layer 103, and the barrier layer 101 form source/drain contact plugs 108 (may also be referred to as source/drain contacts).

FIG. 19B shows details of the lower portion 180L and the upper portion 180U of the source/drain contact 108. For ease of discussion, the lower portion 180L and the upper portion 180U may also be referred to as lower source/drain contact 180L and upper source/drain contact 180U, respectively. The lower source/drain contact 180L includes portions of the source/drain contact 108 up to the upper surface 105U of the seed layer 105. In the illustrated embodiment, the seed layer 105, the modified barrier layer 103, and the barrier layer 101 have a coplanar upper surface 105U. The upper source/drain contact 108U is disposed above the lower source/drain contact 105L.

In the illustrated embodiment of FIG. 19A, the lower source/drain contact 108L has U-shaped (in the cross-sectional view of FIG. 19A) barrier layer 101, U-shaped modified barrier layer 103, and U-shaped seed layer 105. The electrically conductive material 109 in the lower source/drain contact 108L is surrounded by the U-shaped seed layer 105. The upper source/drain contact 108 U includes only the electrically conductive material 109. In the example of FIGS. 19A-19C, the sidewalls of the electrically conductive material 109 in the upper source/drain contact 108U are aligned along the same vertical lines with respective sidewalls of the barrier layer 101 in the lower source/drain contact 108L.

As discussed above, the seed layer 105 protects the silicide regions 95 and/or the source/drain regions 80 from the etching processes and the ashing process, and prevents diffusion of fluoride (from $WF_6$ used in forming the electrically conductive material 109) into, e.g., the source/drain regions 80. The seed layer 105 also facilitates growth (e.g., deposition) of the electrically conductive material 109 (e.g., W) in the lower source/drain contact 180L, and ensures that no void region (e.g., empty space) is formed in the lower source/drain contact 180L. Once the lower source/drain contact 108L is formed, the electrically conductive material 109 is formed over the lower source/drain contact 108L without the seed layer 105, this allows a bottom-up approach to fill the opening 93 quickly without forming voids.

As illustrated in FIG. 19B, in the lower source/drain contact 108L, seams 121 are formed. In some embodiments, the electrically conductive material 109 grows on the seed layer 105 along the directions of the arrows in FIG. 19B, and a merge line (e.g., a seam) is formed when different portions of the electrically conductive material 109 growing along opposing directions merge together. Therefore, the seams 121 may be formed in the previous protrusion portions 93P of the opening 93 (now filled by the electrically conductive material 109), and may be formed in an area above the merged portion of the source/drain regions 80. The seams 121 are also illustrated in FIG. 19A. In some embodiments, the seams 121 are formed below the upper surface 105U of the seed layer 105, and no seem is formed above the upper surface 105U.

After the lower source/drain contact 108L is formed, the formation process of the electrically conductive material 109 continues to fill the remaining portion of the opening 93, thereby forming the upper source/drain contact 180U. Note that there is no seed layer 105 in the upper source/drain contact 180U, and therefore, the growth rate and the property of the electrically conductive material 109 formed in the upper source/drain contact 108U and the lower source/drain contact 108L may be different. In the illustrated embodiments, the grain size of the electrically conductive material 109 in the upper source/drain contact 108U is larger than the grain size of the electrically conductive material 109 in the lower source/drain contact 108L. FIG. 19B shows (in exaggeration) grains 109L of the electrically conductive material 109 with larger size (e.g., diameter) in the upper source/drain contact 108U, and grains 109S of the electrically conductive material 109 with smaller size in the lower source/drain contact 108L.

Next, gate contacts 112 (may also be referred to as gate contact plugs) are formed in the second ILD 92. Each of the gate contacts 112 includes a barrier layer 111, a seed layer 113, and an electrically conductive material 115, and is electrically coupled to an underlying replacement gate structure 97. The materials and the formation methods for the barrier layers 111, the seed layer 113 and the electrically conductive material 115 may be the same as or similar to those discussed above for the barrier layers 96, the seed layer, and the gate electrode 99 of the replacement gate structure 97, respectively, thus details are not repeated.

FIG. 19C illustrates the FinFET device of FIGS. 19A and 19B, but along cross-section B-B. The number and the location of the gate contact 112 illustrated in FIG. 19C are for illustration purpose only and are not limiting.

Additional processing may follow the processing of FIGS. 19A-19C to finish the fabrication of the FinFET device 100, as one skilled in the art readily appreciates. For example, interconnect structures comprising conductive lines (e.g., copper lines) and vias may be formed in a plurality of dielectric layers to interconnect the components (e.g., transistors) formed on the substrate 50 to form functional circuits. Conductive pads may be formed over the interconnect structures for electrical connection to the integrate circuit (IC) device formed. Details are not discussed here.

FIGS. 20-24 and 25A-25C illustrate cross-sectional views of a FinFET device 100A at various stages of fabrication, in accordance with another embodiment. The processing in FIG. 20 follows the processing step shown in FIG. 11B. In other words, FIGS. 2-7, 8A-8C, 9, 10A, 10B, 11A, 11B, 20-24 and 25A-25C illustrate the processing steps to form the FinFET device 100A.

Figure 20:
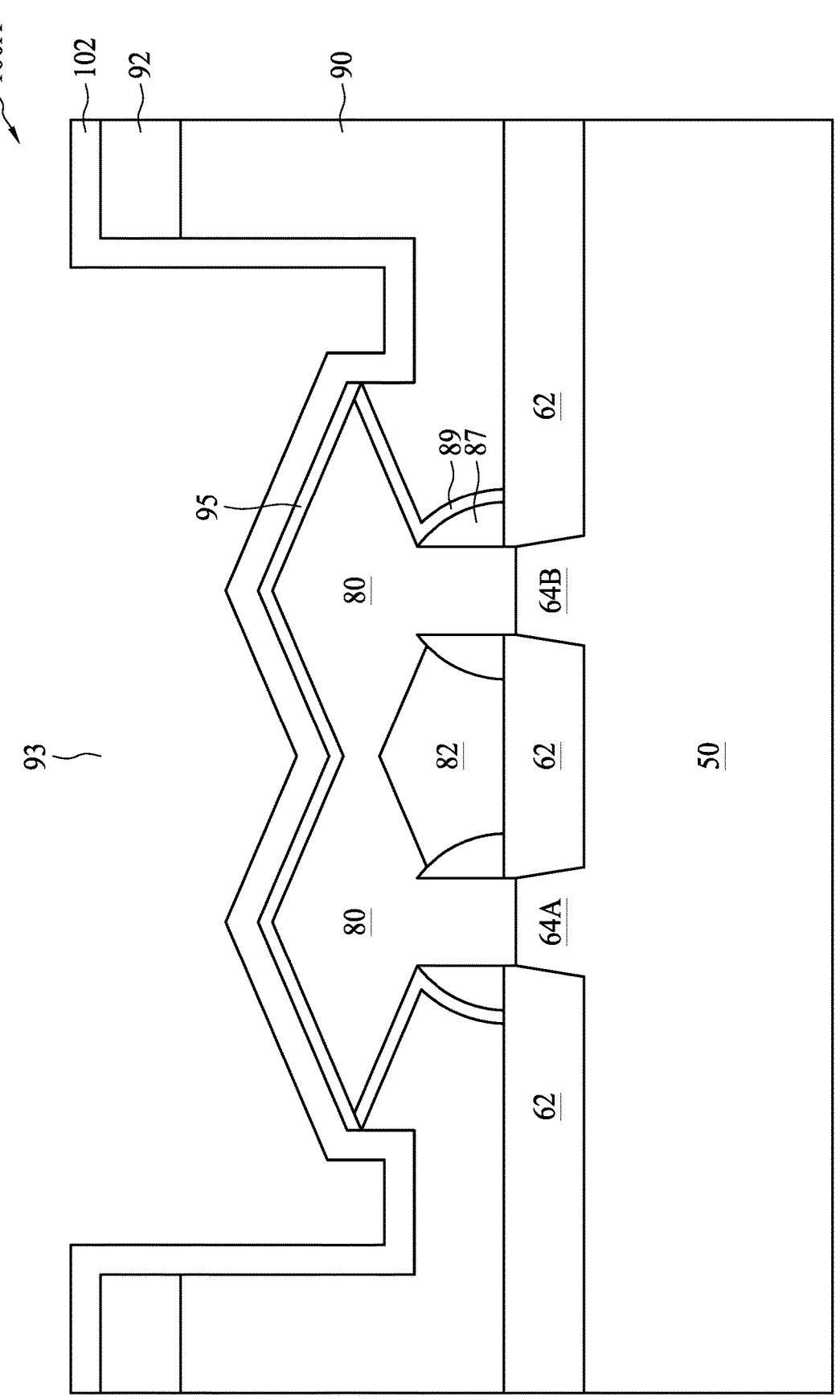
FIGS. 20-24 and 25A-25C illustrate cross-sectional views of a FinFET device at various stages of fabrication, in accordance with another embodiment.

Referring to FIG. 20, silicide regions 95 are formed on the source/drain regions 80, and a barrier layer 102 is formed (e.g., conformally) in the openings 93, e.g., on the silicide regions 95 and along the bottoms and the sidewalls of the openings 93. In some embodiments, the silicide regions 95 are formed by a CVD process using a gas source comprising titanium tetrachloride (TiCl₄) and H₂, e.g., through chemical reaction between TiCl₄ gas and H₂ plasma. The chemical reaction between TiCl₄ gas and H₂ plasma produces titanium, which is deposited in the openings 93, e.g., on the source/drain regions 80 and along the bottoms and sidewalls of the openings 93. The titanium deposited on the source/drain regions 80 reacts with the material (e.g., Si) of the source/drain regions 80 to form titanium silicide (e.g., TiSi) as the silicide regions 95, e.g., under the high temperature of the CVD process, or by an additional thermal process.

Next, the barrier layer 102 is formed by an ALD process. A thickness of the barrier layer 102 may be between about 5 angstroms and about 30 angstroms. In an embodiment, the barrier layer 102 is a layer of TiN formed by a plurality of deposition cycles (also referred to as cycles) of the ALD process. For example, a cycle of the ALD process may include the following steps. In step 1, a precursor comprising TiCl₄ is supplied to the deposition chamber of the ALD process. In step 2, un-used precursor and by-product(s) of the first step is pumped out of the deposition chamber. In step 3, a precursor comprising NH₃ (e.g., NH₃ plasma) is supplied to the deposition chamber of the ALD process. In step 4, un-used precursor and by-product(s) of the third step is pumped out of the deposition chamber. In the ALD process, the nitrogen in the NH₃ reacts with the previous monolayer formed at the reaction surface, and does not react with the material (e.g., Si) of the source/drain regions 80. Therefore, the ALD process forms a layer of TiN as the barrier layer 102 with little or no SiN in the barrier layer 102 (e.g., the concentration of SiN in the barrier layer 102 is less than 16 mol %), which is conducive to the formation of the seed layer 105.

In another embodiment, the barrier layer 102 is a layer of TiN formed by a plurality of deposition cycles of an ALD process using different precursors from the above example. In particular, in step 1 of the deposition cycle, a precursor comprising Tetrakis (dimethylamino) titanium (TDMAT) is supplied to the deposition chamber of the ALD process, and in step 3 of the deposition cycle, N₂H₂ plasma is supplied to the deposition chamber of the ALD process. Other details of the ALD process are the same as or similar to those discussed above, thus not repeated.

Figure 21:
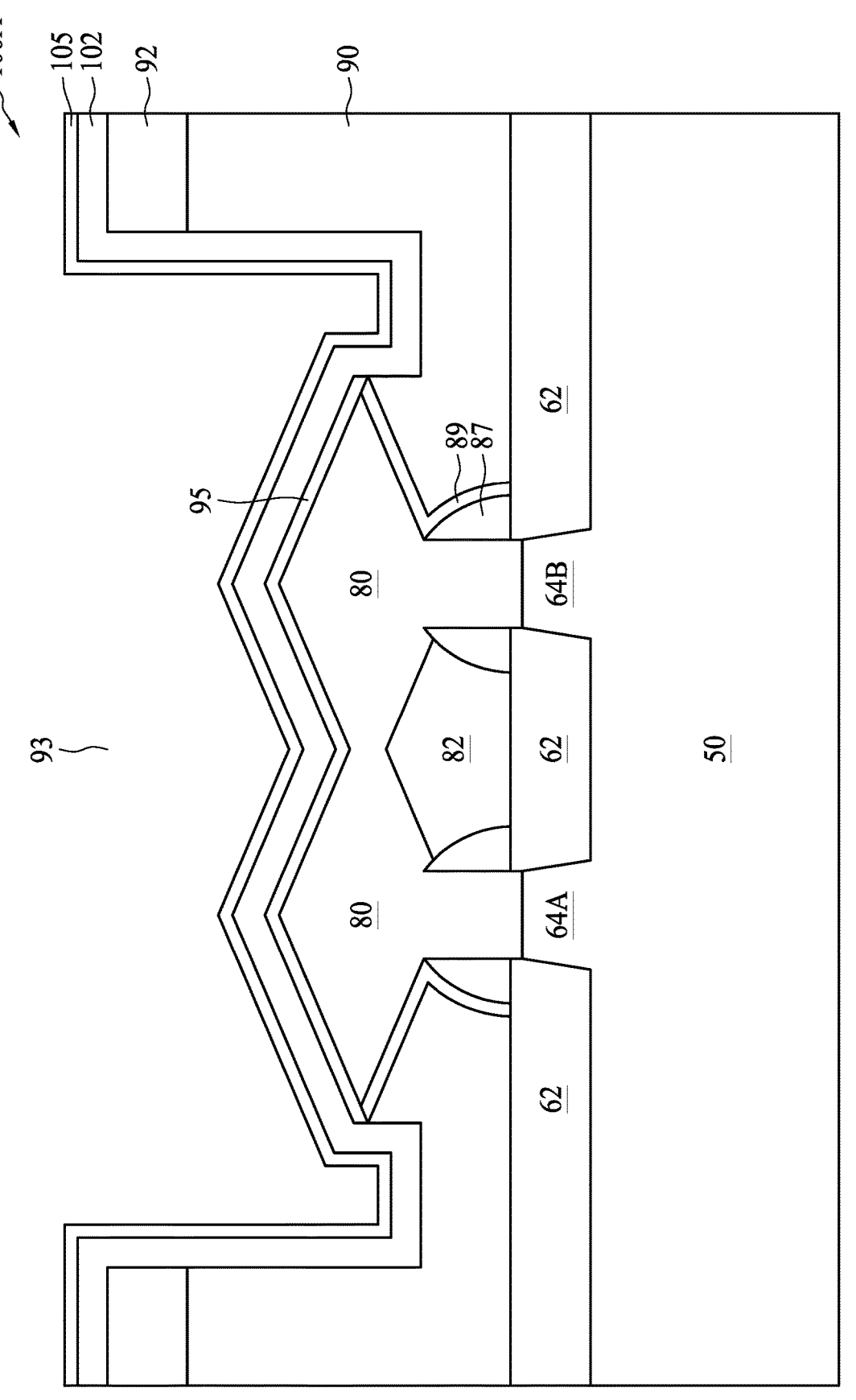

Next, in FIG. 21, the seed layer 105 is formed (e.g., conformally) on the barrier layer 102. Details are the same as or similar to those discussed above, thus not repeated here.

Figure 22:
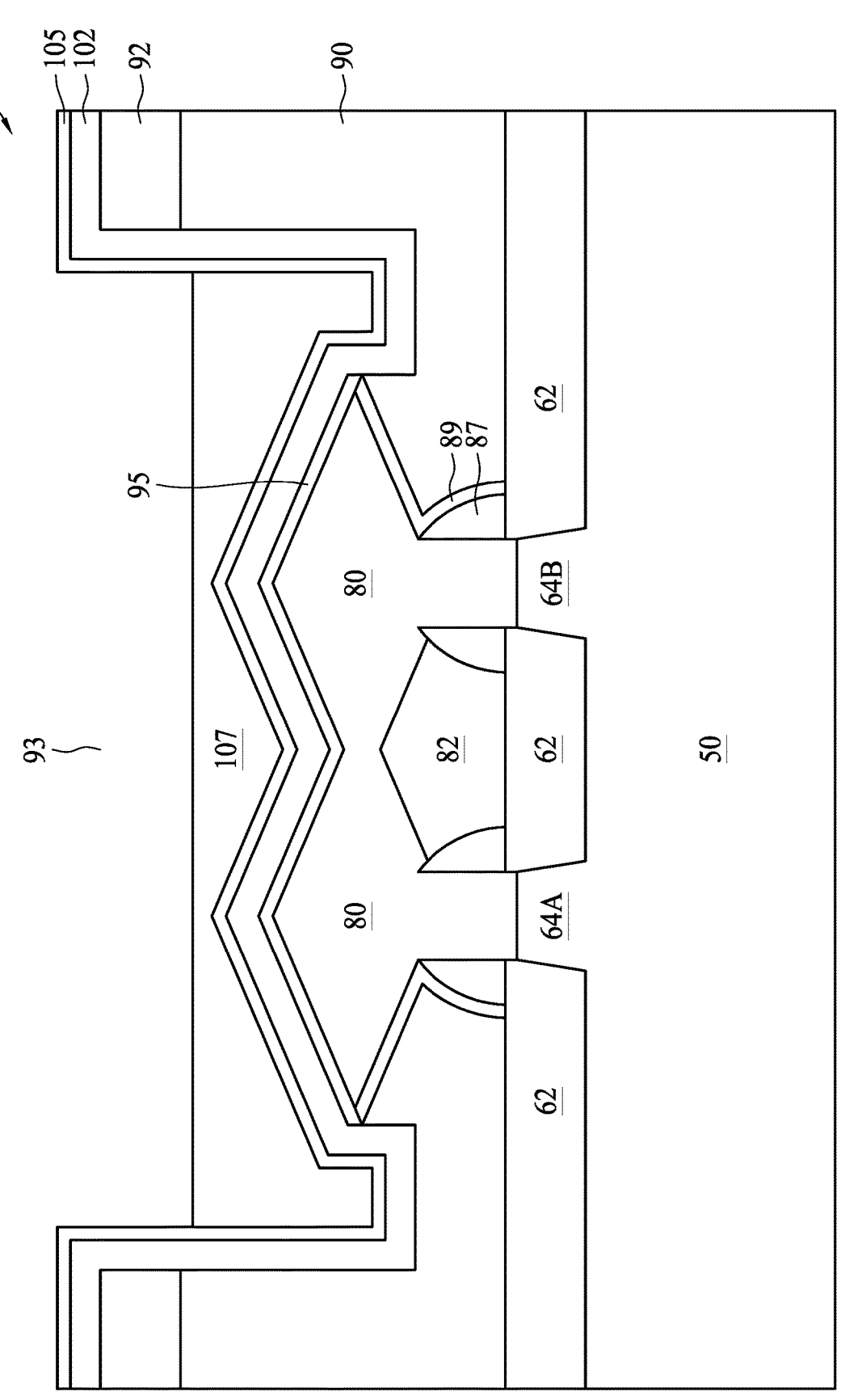

Next, in FIG. 22, the photoresist layer 107 (e.g., a BARC layer) is formed to fill the openings 93, and then etched back using an etching process (e.g., dry etching). Details are the same as or similar to those discussed above, thus not repeated here.

Figure 23:
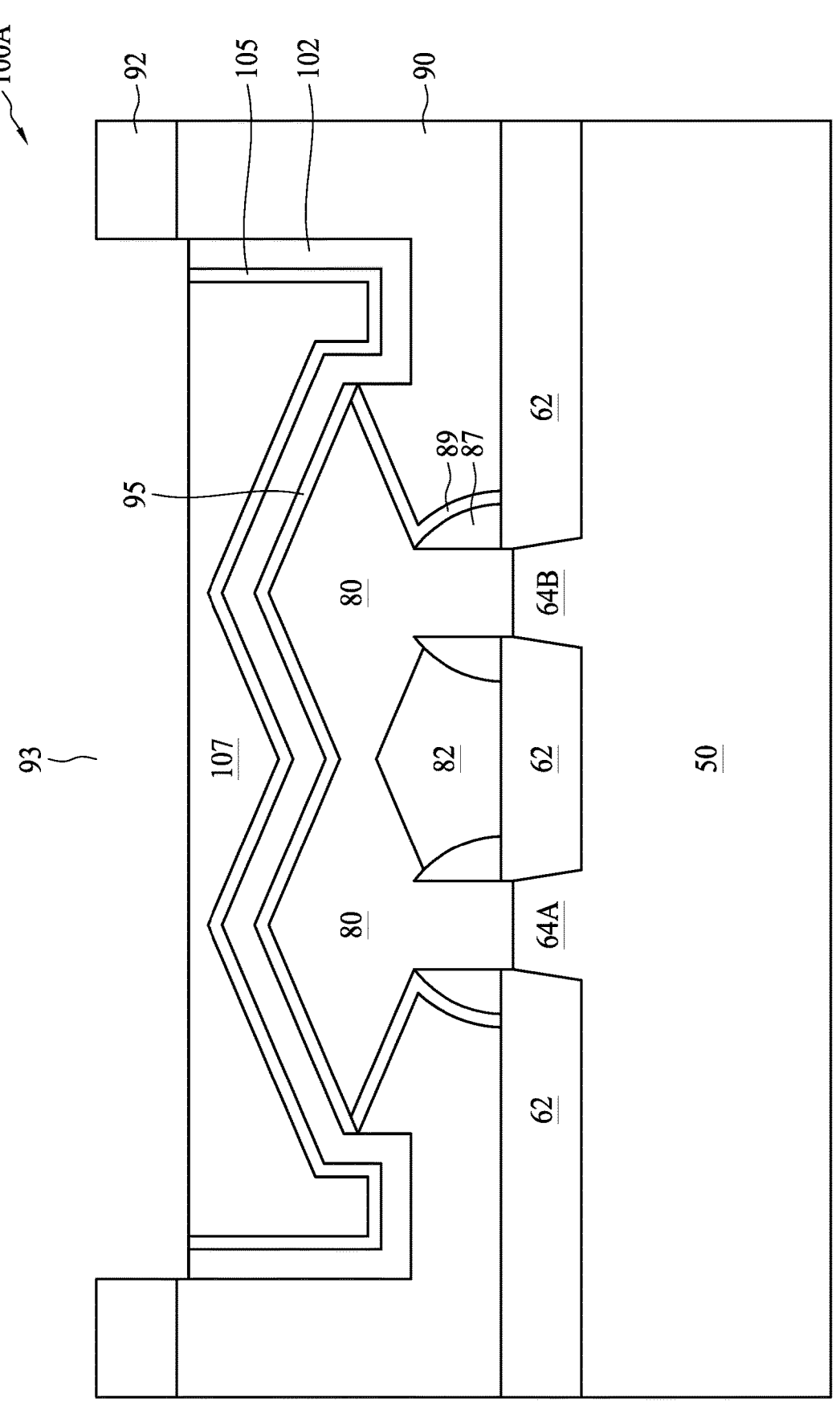

Next, in FIG. 23, upper portions of the barrier layer 102 and upper portions of the seed layer 105 disposed above the upper surface of the photoresist layer 107 are removed, e.g., by a wet etch process. Details are the same as or similar to those discussed above, thus not repeated here.

Figure 24:
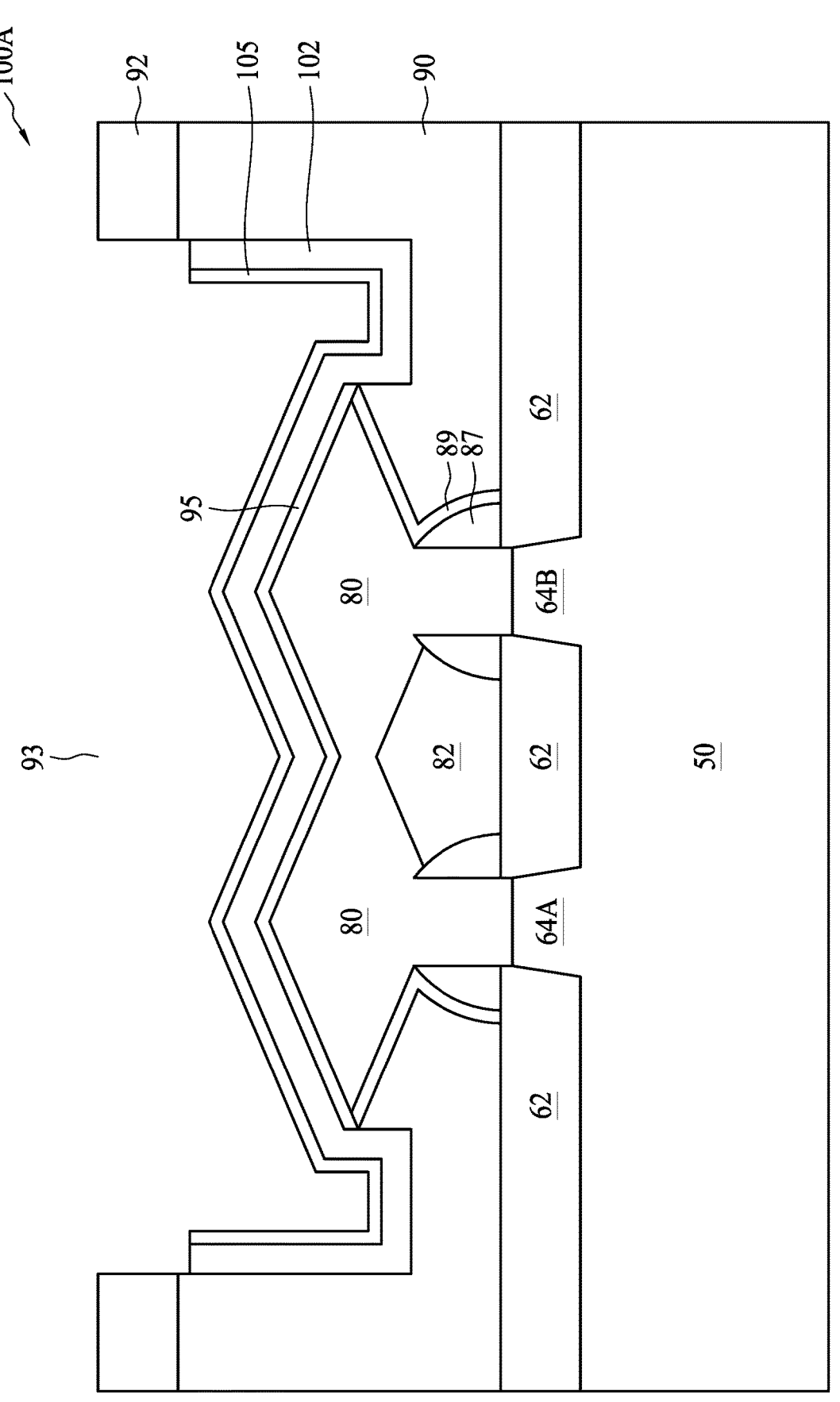

Next, in FIG. 24, the photoresist layer 107 is removed, e.g., by an ashing process to expose the seed layer 105. Details are the same as or similar to those discussed above, thus not repeated here.

Figure 25A:
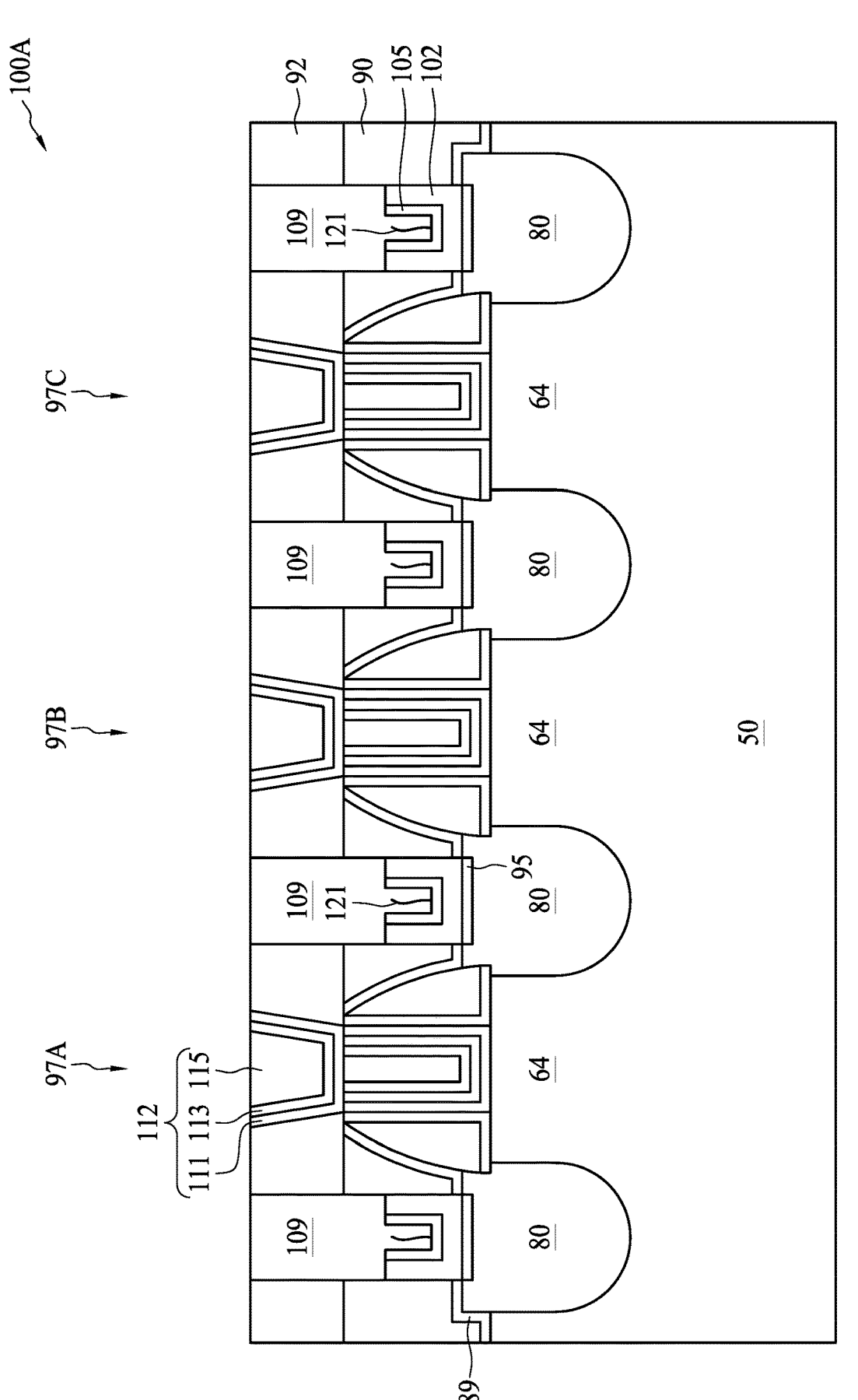
Figure 25B:
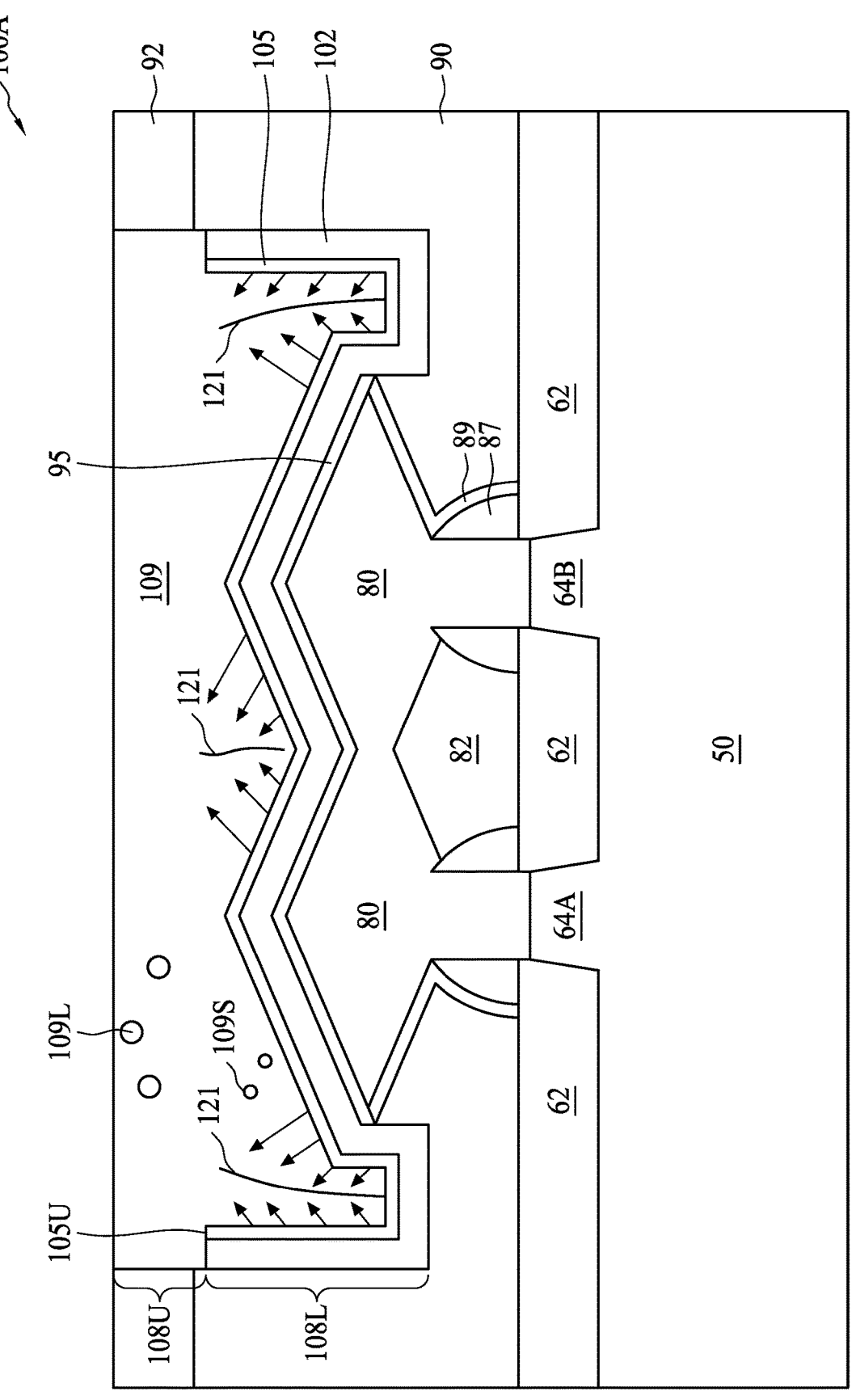
Figure 25C:
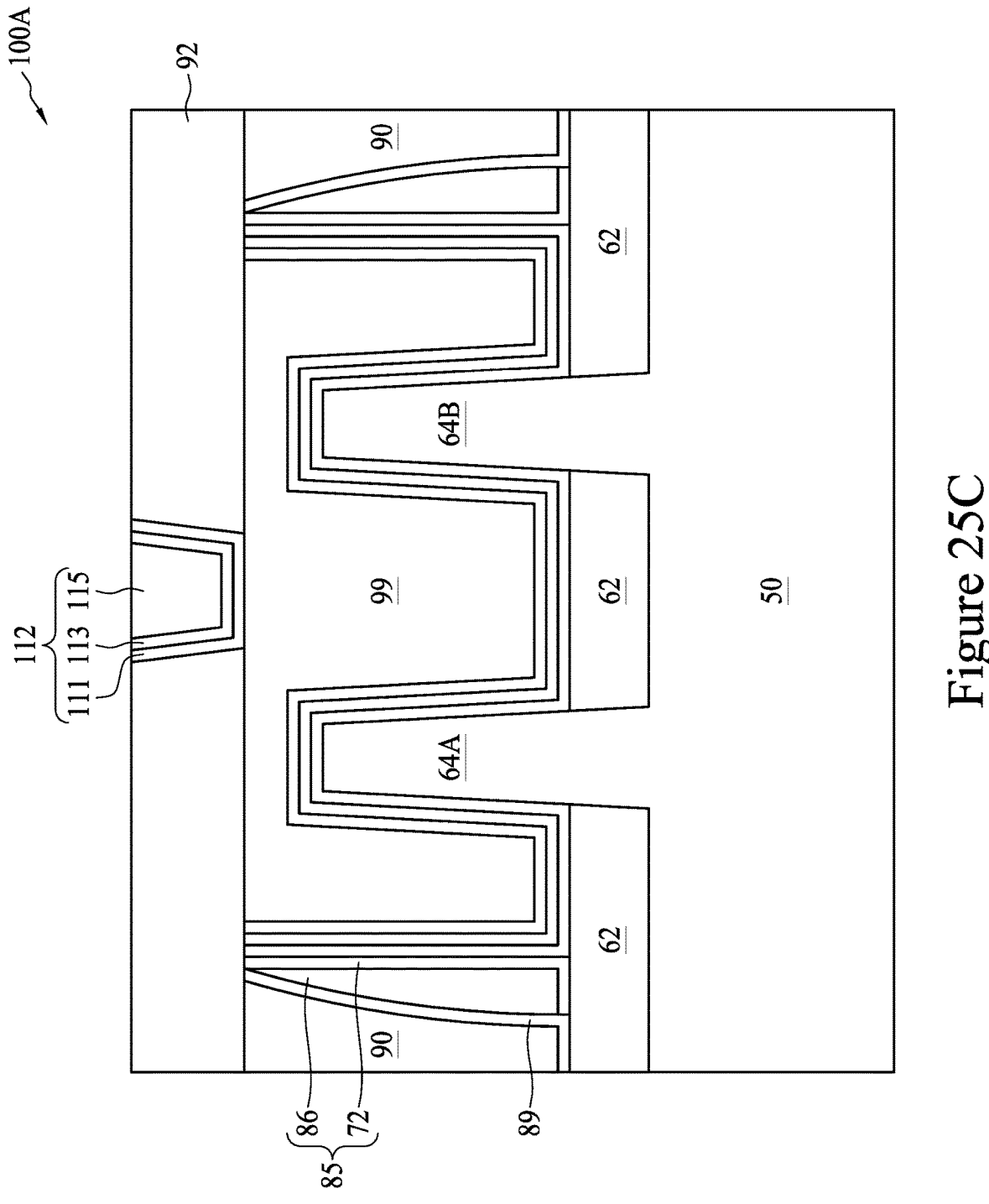

Next, in FIGS. 25A-25C, the electrically conductive material 109 is formed to fill the openings 93, and a planarization process, such as CMP, is performed next to remove excess portions of the electrically conductive material 109. After the planarization process, the source/drain contact plugs 108 are formed. Seams 121 are formed in lower source/drain contacts 108L, and no seam is formed in upper source/drain contacts 108U. The electrically conductive material 109 in the upper source/drain contacts 108U may have larger grain size than the electrically conductive material 109 in the lower source/drain contacts 108L. Next, the gate contacts 112 are formed over and electrically coupled to the replacement gate structures 97. Details are the same as or similar to those discussed above, thus not repeated here.

Embodiments may achieve advantages. For example, the disclosed methods, by reducing the concentration of SiN in the modified barrier layers 103, or by forming barrier layer 102 with little or no SiN, allows the seed layer 105 to be formed reliably with enough thickness on the barrier layer (e.g., 103 or 102). The seed layer 105 protects the silicide regions 95 and/or the source/drain regions 80 from damages caused by subsequent processing (e.g., etching, ashing), and also prevents diffusion of fluoride when the electrically conductive material 109 is formed. As a result, the electrical resistance of the source/drain contact plugs is reduced, the device performance is improved, and production yield is improved.

FIG. 27 illustrates a flow chart of a method 1000 of forming a semiconductor device, in accordance with some embodiments. It should be understood that the embodiment method shown in FIG. 27 is merely an example of many possible embodiment methods. One of ordinary skill in the art would recognize many variations, alternatives, and modifications. For example, various steps as illustrated in FIG. 27 may be added, removed, replaced, rearranged and repeated.

Referring to FIG. 27, at block 1010, a gate structure is formed over a fin that protrudes above a substrate. At block 1020, a source/drain region is formed over the fin adjacent to the gate structure. At block 1030, an interlayer dielectric (ILD) layer is formed over the source/drain region around the gate structure. At block 1040, an opening is formed in the ILD layer to expose the source/drain region. At block 1050, a silicide region and a barrier layer are formed successively in the openings over the source/drain region, wherein the barrier layer comprises silicon nitride. At block 1060, a concentration of silicon nitride in a surface portion of the barrier layer exposed to the opening is reduced. At block 1070, after the reducing, a seed layer is formed on the barrier layer. At block 1080, an electrically conductive material is formed on the seed layer to fill the opening.

In accordance with an embodiment, a method of forming a semiconductor device includes: forming a gate structure over a fin that protrudes above a substrate; forming a source/drain region over the fin adjacent to the gate structure; forming an interlayer dielectric (ILD) layer over the source/drain region around the gate structure; forming an opening in the ILD layer to expose the source/drain region; forming a silicide region and a barrier layer successively in the openings over the source/drain region, wherein the barrier layer comprises silicon nitride; reducing a concentration of silicon nitride in a surface portion of the barrier layer exposed to the opening; after the reducing, forming a seed layer on the barrier layer; and forming an electrically conductive material on the seed layer to fill the opening. In an embodiment, the method further comprises, after forming the seed layer and before forming the electrically conductive material, removing the barrier layer and the seed layer from upper sidewalls of the opening while keeping lower sidewalls of the opening covered by the barrier layer and the seed layer. In an embodiment, the opening is formed to have a protrusion portion disposed laterally between the source/drain region and the ILD layer, wherein a lower portion of the electrically conductive material formed in the protrusion portion of the opening has a seam. In an embodiment, an upper portion of the electrically conductive material extends further from the substrate than an upper surface of the seed layer distal from the substrate, wherein no seam is formed in the upper portion of the electrically conductive material. In an embodiment, the upper portion of the electrically conductive material is formed to have a larger grain size than the lower portion of the electrically conductive material. In an embodiment, reducing the concentration of silicon nitride comprises treating the barrier layer with a plasma process. In an embodiment, the plasma process breaks chemical bonds of the surface portion of the barrier layer. In an embodiment, reducing the concentration of silicon nitride comprises performing a wet etch process to treat the barrier layer. In an embodiment, the wet etch process is an oxidization process, wherein the oxidization process breaks chemical bonds of the surface portion of the barrier layer. In an embodiment, the silicide region comprises titanium silicide, and the barrier layer comprises titanium silicon nitride and titanium nitride, wherein reducing the concentration of silicon nitride reduces the concentration of silicon nitride in the surface portion of the barrier layer below 16 molecular percentage. In an embodiment, reducing the concentration of silicon nitride increases a concentration of titanium oxide in the surface portion of the barrier layer. In an embodiment, forming the seed layer comprises forming a conformal tungsten seed layer using a first thermal deposition process. In an embodiment, forming the electrically conductive material comprises forming, using a second thermal deposition process, a tungsten layer over the seed layer to fill the opening, wherein the first thermal deposition process and the second thermal deposition process are performed using different gas sources.

In accordance with an embodiment, a method of forming a semiconductor device includes: forming a gate structure over a fin that protrudes above a substrate; forming a source/drain region over the fin adjacent to the gate structure; forming dielectric layer over the source/drain region around the gate structure; forming an opening in the dielectric layer to expose the source/drain region; forming a silicide region on the source/drain region; lining sidewalls and a bottom of the opening by forming a barrier layer in the opening on the silicide region, wherein a molecular percentage (mol %) of silicon nitride in the barrier layer is less than about 16 mol %; forming a seed layer on the barrier layer; and filling the opening by forming an electrically conductive material on the seed layer. In an embodiment, the method further comprises, after forming the seed layer and before forming the electrically conductive material, recessing the barrier layer and the seed layer by removing the barrier layer and the seed layer from upper sidewalls of the opening. In an embodiment, forming the seed layer comprises forming a conformal tungsten seed layer using a first deposition process, wherein forming the electrically conductive material comprises forming a tungsten layer over the seed layer using a second deposition process, wherein the first deposition process and the second deposition process are performed using different precursors. In an embodiment, after the second deposition process, a seam is formed in a lower portion of the electrically conductive material, and no seam is formed in an upper portion of the electrically conductive material, wherein the lower portion of the electrically conductive material is disposed laterally between the source/drain region and the dielectric layer, and the upper portion of the electrically conductive material is disposed over the source/drain region and extends further from the substrate than an upper surface of the seed layer distal from the substrate.

In accordance with an embodiment, a semiconductor device includes: a fin protruding above a substrate; a gate structure over the fin; a source/drain region over the fin adjacent to the gate structure; a silicide region on the source/drain region; a dielectric layer over the source/drain region around the gate structure; and a contact plug extending through the dielectric layer and electrically coupled to the silicide region, wherein an upper portion of the contact plug comprises an electrically conductive material, wherein a lower portion of the contact plug comprises: a barrier layer extending along an upper surface of the silicide region and along sidewalls of the dielectric layer; a seed layer over the barrier layer; and the electrically conductive material over the seed layer and surrounded by the seed layer. In an embodiment, sidewalls of the electrically conductive material of the upper portion of the contact plug are vertically aligned with respective sidewalls of the barrier layer contacting the dielectric layer. In an embodiment, there is seam in the electrically conductive material of the lower portion of the contact plug, wherein the electrically conductive material of the upper portion of the contact plug is free of seams.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:

forming a gate structure over a fin that protrudes above a substrate;

forming a source/drain region over the fin adjacent to the gate structure;

forming an interlayer dielectric (ILD) layer over the source/drain region around the gate structure;

forming an opening in the ILD layer to expose the source/drain region, wherein the opening is formed to have a protrusion portion disposed laterally between the source/drain region and the ILD layer;

forming a silicide region and a barrier layer successively in the opening over the source/drain region, wherein the barrier layer comprises silicon nitride;

reducing a concentration of silicon nitride in a surface portion of the barrier layer exposed to the opening;

after the reducing, forming a seed layer on the barrier layer; and forming an electrically conductive material on the seed layer to fill the opening, wherein a lower portion of the electrically conductive material formed in the protrusion portion of the opening has a seam.

2. The method of claim 1, further comprising, after forming the seed layer and before forming the electrically conductive material, removing the barrier layer and the seed layer from upper sidewalls of the opening while keeping lower sidewalls of the opening covered by the barrier layer and the seed layer.

3. The method of claim 1, wherein an upper portion of the electrically conductive material extends further from the substrate than an upper surface of the seed layer distal from the substrate, wherein no seam is formed in the upper portion of the electrically conductive material.

4. The method of claim 3, wherein the upper portion of the electrically conductive material is formed to have a larger grain size than the lower portion of the electrically conductive material.

5. The method of claim 1, wherein reducing the concentration of silicon nitride comprises treating the barrier layer with a plasma process.

6. The method of claim 5, wherein the plasma process breaks chemical bonds of the surface portion of the barrier layer.

7. The method of claim 1, wherein reducing the concentration of silicon nitride comprises performing a wet etch process to treat the barrier layer.

8. The method of claim 7, wherein the wet etch process is an oxidization process, wherein the oxidization process breaks chemical bonds of the surface portion of the barrier layer.

9. The method of claim 1, wherein the silicide region comprises titanium silicide, and the barrier layer comprises titanium silicon nitride and titanium nitride, wherein reducing the concentration of silicon nitride reduces the concentration of silicon nitride in the surface portion of the barrier layer below 16 molecular percentage.

10. The method of claim 9, wherein reducing the concentration of silicon nitride increases a concentration of titanium oxide in the surface portion of the barrier layer.

11. The method of claim 1, wherein forming the seed layer comprises forming a conformal tungsten seed layer using a first thermal deposition process.

12. The method of claim 11, wherein forming the electrically conductive material comprises forming, using a second thermal deposition process, a tungsten layer over the seed layer to fill the opening, wherein the first thermal deposition process and the second thermal deposition process are performed using different gas sources.

13. A method of forming a semiconductor device, the method comprising:
forming a gate structure over a fin that protrudes above a substrate;
forming a source/drain region over the fin adjacent to the gate structure;
forming a dielectric layer over the source/drain region around the gate structure;
forming an opening in the dielectric layer to expose the source/drain region;
forming a silicide region on the source/drain region;
lining sidewalls and a bottom of the opening by forming a barrier layer in the opening on the silicide region, wherein a molecular percentage (mol %) of silicon nitride in the barrier layer is less than about 16 mol %;
forming a seed layer on the barrier layer; and
filling the opening by forming an electrically conductive material on the seed layer.

14. The method of claim 13, further comprising, after forming the seed layer and before forming the electrically conductive material, recessing the barrier layer and the seed layer by removing the barrier layer and the seed layer from upper sidewalls of the opening.

15. The method of claim 13, wherein forming the seed layer comprises forming a conformal tungsten seed layer using a first deposition process, wherein forming the electrically conductive material comprises forming a tungsten layer over the seed layer using a second deposition process, wherein the first deposition process and the second deposition process are performed using different precursors.

16. The method of claim 15, wherein after the second deposition process, a seam is formed in a lower portion of the electrically conductive material, and no seam is formed in an upper portion of the electrically conductive material, wherein the lower portion of the electrically conductive material is disposed laterally between the source/drain region and the dielectric layer, and the upper portion of the electrically conductive material is disposed over the source/drain region and extends further from the substrate than an upper surface of the seed layer distal from the substrate.

17. A semiconductor device comprising:
a fin protruding above a substrate;
a gate structure over the fin;
a source/drain region over the fin adjacent to the gate structure;
a silicide region on the source/drain region;
a dielectric layer over the source/drain region around the gate structure; and
a contact plug extending through the dielectric layer and electrically coupled to the silicide region, wherein an upper portion of the contact plug comprises an electrically conductive material, wherein a lower portion of the contact plug comprises:
a barrier layer extending along an upper surface of the silicide region and along sidewalls of the dielectric layer;
a seed layer over the barrier layer; and
the electrically conductive material over the seed layer and surrounded by the seed layer, wherein there is a seam in the electrically conductive material of the lower portion of the contact plug, wherein the electrically conductive material of the upper portion of the contact plug is free of seams.

18. The semiconductor device of claim 17, wherein sidewalls of the electrically conductive material of the upper portion of the contact plug are vertically aligned with respective sidewalls of the barrier layer contacting the dielectric layer.

19. The semiconductor device of claim 17, wherein the electrically conductive material of the upper portion of the contact plug has a larger grain size than the electrically conductive material of the lower portion of the contact plug.

20. The semiconductor device of claim 17, wherein the electrically conductive material of the upper portion of the contact plug contacts and extends along a sidewall of the dielectric layer facing the contact plug.

* * * * *